(12) United States Patent  (10) Patent No.: US 10,768,314 B2
Houha et al.  (45) Date of Patent: Sep. 8, 2020

(54) OPTICAL ELEMENT

(71) Applicants: IQ Structures S.R.O., Husinec-Rez (CZ); Crytur SOPL. S.R.O., Turnov (CZ)

(72) Inventors: Roman Houha, Prague (CZ); Tomas Tethal, Husinec Rez (CZ); Zbynek Ryzi, Littleton, MA (US); Jan Kubat, Zdar u Mnichova Hradiste (CZ); Tomas Fidler, Decin (CZ)

( * ) Notice: Subject to any disclaimer, the term of this patent is extended or adjusted under 35 U.S.C. 154(b) by 0 days.

(21) Appl. No.: 15/735,275

(22) PCT Filed: Jun. 10, 2016

(86) PCT No.: PCT/EP2016/063295
§ 371 (c)(1),
(2) Date: Dec. 11, 2017

(87) PCT Pub. No.: WO2016/198598
PCT Pub. Date: Dec. 15, 2016

(65) Prior Publication Data
US 2018/0120451 A1  May 3, 2018

(30) Foreign Application Priority Data
Jun. 11, 2015  (GB) .................................. 1510211.4

(51) Int. Cl.
*G01T 1/20* (2006.01)
*H01L 33/50* (2010.01)
(Continued)

(52) U.S. Cl.
CPC .............. *G01T 1/2002* (2013.01); *F21K 9/64* (2016.08); *G01T 1/202* (2013.01); *H01L 27/14663* (2013.01); *H01L 33/505* (2013.01)

(58) Field of Classification Search
CPC ......... F21K 9/64; G01T 1/2002; G01T 1/202; H01L 27/14663; H01L 33/505
See application file for complete search history.

(56) References Cited

U.S. PATENT DOCUMENTS 7,388,230 B1  6/2008 Lebby
7,605,531 B1  10/2009 Lebby et al.
(Continued)

FOREIGN PATENT DOCUMENTS

WO  WO 2014/128957  8/2014

*Primary Examiner* — Mark R Gaworecki
(74) *Attorney, Agent, or Firm* — Taylor Russell & Russell, P.C.

(57) ABSTRACT

An optical element (1) comprises:
a body (2) of radiation converting monocrystalline material, e.g. of a luminescent or scintillator material, and
an extraction structure (4, 6) applied to at least one output or input surface of the body (2);
wherein the extraction structure (4, 6) is constructed and configured such that radiation at an output (19) of the body (2) is directionally modified, especially in terms of energy or intensity or of directional distribution or of both, as compared with radiation at the output of the body (2) in the absence of said extraction structure (4, 6), by interaction of radiation entering and/or propagating within and/or exiting the body (2) with the said extraction structure (4, 6), e.g. such as to reduce or ameliorate the deleterious effects of TIR within the body (2).

20 Claims, 8 Drawing Sheets

(51) Int. Cl.
*H01L 27/146* (2006.01)
*F21K 9/64* (2016.01)
*G01T 1/202* (2006.01)

(56) References Cited

U.S. PATENT DOCUMENTS

| | | |
|---|---|---|
| 8,680,507 B1 | 3/2014 | Arkun et al. |
| 2006/0192308 A1 | 8/2006 | Juni |
| 2011/0079798 A1 | 4/2011 | Ogihara |
| 2013/0062610 A1 | 3/2013 | Clark |
| 2014/0110591 A1* | 4/2014 | Reboud ................ G01T 1/2002 250/366 |

* cited by examiner

OPTICAL ELEMENT

FIELD OF THE INVENTION

This invention relates to optical elements, especially though not exclusively luminescent optical elements. More particularly, though not exclusively, the invention relates to optical elements based on luminescent materials and which have modified or enhanced optical characteristics.

BACKGROUND OF THE INVENTION AND PRIOR ART

Luminescent or scintillating monocrystalline materials, such as YAG (yttrium aluminium garnet, $Y_3Al_5O_{12}$), YAP (yttrium aluminium perovskite, $YAlO_3$), YSO (yttrium orthosilicate, $Y_2SiO_5$), LYSO (lutetium yttrium orthosilicate, $\{Lu,Y\}_2SiO_5$), LPS (lutetium pyrosilicate, $Lu_2SiO_7$) and sapphire ($Al_2O_3$), doped with ions of rare earth elements (e.g. Ce, Pr) or certain transition metals (e.g. Cr, Zr, Ti), very often show high refractive indices, frequently exceeding the value of 1.8, and luminescence in the ultraviolet (UV), visible and near-infrared regions of the electromagnetic spectrum.

These monocrystalline materials can be used for instance as scintillators in the detection of ionising radiation such as gamma rays, X-rays, beta- or alpha-particles, or extreme ultraviolet (E-UV) or UV radiation. They can also be used in light conversion elements in optoelectronics, especially in the field of LED's, where they are known as "luminophores".

Luminescence in certain materials, however, may occur also by other mechanisms apart from photoluminescence, such as electroluminescence, thermoluminescence, mechanoluminescence, and others.

Such monocrystalline materials may thus be generally termed "radiation converting materials" so as to encompass all such applications.

The converted radiation output from such monocrystalline materials is limited by the difference between the refractive indices of a low-index ambient environment, e.g. typically air or a vacuum, and the high-index monocrystalline material itself. The resulting maximum angle at which the emitted or converted light can still leave the monocrystal is subject to Snell's law. For materials with a refractive index of 1.8, the maximum output angle of the ray of light incident on the exit surface of a plate of the material which can still exit the plate is 33°45' (measured from the surface normal). This means that only a minor proportion of the radiation impacting on the plate exit surface can be extracted from it into the ambient environment. Moreover, this value is further reduced if one takes into consideration the fact that the intensity and spatial distribution of outgoing radiation further depends on the application, the size of the body of monocrystalline material and the method of excitation of the radiation.

When such monocrystalline materials are exposed to exciting radiation (and/or subjected to other luminescence mechanisms), scintillation—i.e. emission from the luminescent centres within the structure—begins, and occurs uniformly in all directions. When required to detect high-energy radiation, such scintillators are frequently used in the form of thin monocrystalline slices polished in order to achieve the best possible spatial resolution. In light convertors, e.g. in LED applications, the luminophore is typically also used in the form of a thin plate or platelet.

As a consequence of their high refractive index, the thin slices of the monocrystalline material show a significant light-guiding effect being the phenomenon of total internal reflection (TIR), in which a large proportion of the radiation is disseminated by multiple reflections at the material-environment interface into the body or side regions of the monocrystalline material, from which it subsequently exits to the environment in one or more directions which are undesirable. Emission of the radiation from such regions or in such directions is undesirable because it can be considered as a loss for practical application purposes. Moreover, with increasing distance that the converted radiation has to travel inside the monocrystalline material, the probability of self-absorption occurring in the heterogeneities and impurities contained therein increases.

The currently widely used monocrystalline materials of a doped silicate type, e.g. $Y_2SiO_5$:Ce or materials based on yttrium aluminium garnet ($Lu_3Al_5O_{12}$:Pr) or perovskite materials ($YAlO_3$:Ce), generally show high refractive indices (namely 1.78, 1.84 and 1.95 respectively). As mentioned above, this results in extraction of light from the material-air interface with only a low light output, and a large proportion of the light is reflected from the interface back into the material by TIR. Moreover, such limitations on the light output can cause a low output even in newly developed materials with excellent luminous yields exceeding those of materials currently in commercial use.

Furthermore, radiation which is converted by a luminophore generally is omnidirectional in comparison with the light generated by an LED device. This effect can cause undesirable in homogeneous distributions of radiated light and can also cause problems in viewing angle and problems with light collimation.

In the current state of the technology, all the types of luminescors or scintillators described above have a disadvantage in that the high refractive index of the material and their shapes or layout geometries are such that most of the energy of the light emitted by them is lost through internal reflections, i.e. it is not propagated in a given desired direction, and it may even be eventually radiated out of the luminescor/scintillator body in unwanted or undesirable directions. Therefore, such light sources are very often ineffective; in some cases the typical value of useful radiation emitted from the luminophore can be as little as below 10% of the input radiation energy.

In some known examples of LED technology in this field, such as disclosed in WO 2009/126272A1, WO 2014/173376A1, US 2014/0106488A1 and US 2008/0128730A1, the excitation surface of the luminophore may be polished, textured or treated chemically in order to increase the output level of the emitted radiation. However, this solution at best only partly addresses the problems discussed above, since it only deals with the issue of increasing the amount of radiation emitted; any directing of the output radiation in particular ways is not possible using these known configurations.

In other known art, radiation from an LED can also be extracted using photonic crystals (e.g. as disclosed in WO 2012/108627A2 and WO 2008/060594A2) or thin anti-reflective layers (e.g. as disclosed in US 2012/0313120A1 and US 2004/0188696A1), or by shaping of the luminophore itself in a similar manner to production of hemispheres or spherical caps from a silicone gel over the luminophore in LED technology (e.g. as disclosed in EP 2650934A1), or from silicone gel with dispersed luminophore (e.g. as disclosed in EP 2202444A1). The luminophore can also be worked into other rotationally symmetrical shapes, such as a truncated cone, spherical cap, etc. This may ameliorate the total internal reflection effect to some degree, but production of shapes other than planar slices in a large-batch production context is difficult and costly, particularly when considering the high hardness of these materials (~8 Moh).

SUMMARY OF THE INVENTION

It is therefore a primary object of the present invention to ameliorate or at least partially solve or reduce the above shortcomings of known optical elements based on luminescent materials, and to provide such optical elements that exhibit improved optical output characteristics.

Accordingly, in a first aspect the present invention provides an optical element comprising:
   a body of radiation converting monocrystalline material, and
   an extraction structure applied to at least one surface of the body of radiation converting monocrystalline material;
   wherein the extraction structure is constructed and configured such that radiation at an output of the body of radiation converting monocrystalline material is directionally modified, as compared with radiation at the output of the body of radiation converting monocrystalline material in the absence of said extraction structure, by interaction of radiation entering and/or propagating within and/or exiting the body of radiation converting monocrystalline material with the said extraction structure.

In some embodiments the said output of the body of radiation converting monocrystalline material at which the directional modification of the radiation is defined may be an output surface or an output region or portion of the said body. That output surface or output region or portion may or may not have a said extraction structure actually applied thereto.

In some embodiments the at least one surface of the body having the or a respective extraction structure applied thereto may be an external surface of the body. Thus in some embodiments the extraction structure may be external of the body itself.

In some embodiments the at least one surface of the body of radiation converting monocrystalline material having the, or a respective, extraction structure applied thereto may be a or a respective output surface of the body, whereby the extraction structure acts to directionally modify at least radiation exiting or propagating within the body and interacting with that, or that respective, output surface. In this case the extraction structure(s) may thus act to directly and/or indirectly directionally modify the output radiation outputted from the body.

In some embodiments the at least one surface of the body of radiation converting monocrystalline material having the, or a respective, extraction structure applied thereto may be a or a respective input surface of the body, whereby the extraction structure acts to directionally modify at least radiation entering or propagating within the body and interacting with that, or that respective, input surface. In this case the extraction structure(s) may thus act to indirectly directionally modify the output radiation outputted from the body.

In some embodiments the at least one surface of the body of radiation converting monocrystalline material having the, or a respective, extraction structure applied thereto may be a or a respective surface other than an input or output surface thereof, whereby the extraction structure may act to directionally modify radiation passing through, generated in or propagating within the body and interacting with that other surface. Such another surface, other than an input or output surface, may for example be any side or lateral surface of the body, such as a surface adjacent or opposite an input or an output surface thereof. In this case the extraction structure(s) may thus act to indirectly directionally modify the output radiation outputted from the body.

In certain embodiments the extraction structure, or respective extraction structures, may be applied to any number and combination of one or more output and/or input and/or other surfaces of the body of radiation converting monocrystalline material, whereby the extraction structure(s) may act to directly and/or indirectly directionally modify radiation exiting and/or entering the body via that or those respective output and/or input and/or other surface(s), and/or radiation propagating within the body.

As used herein the term "directionally modify" (or linguistically equivalent terms, e.g. "directional modification") means that the extraction structure is constructed and/or configured and/or located such that it modifies, e.g. modifies directly or indirectly (the latter for example including in combination, addition or synergy with effects of one or more other extraction structures within the optical element) either or both of:
   (i) the energy or intensity of the radiation at the output of the body of radiation converting monocrystalline material via interactions of radiation entering and/or propagating within and/or exiting the said body with the said surface, and/or
   (ii) the directional distribution of radiation exiting and/or entering and/or propagating within the body of radiation converting monocrystalline material via interactions with the said surface, i.e. in other words, it redistributes the energy within the directions of propagation and/or modifies the direction(s) of propagation or spatial distribution of the radiation or its portion (for example represented by a propagating bundle of rays or by a propagating wave front) exiting and/or entering and/or propagating within the body of radiation converting monocrystalline material as it interacts with (e.g. upon passing through or being reflected or transmitted from) the extraction structure, and subsequently (as a result of such interactions) ultimately modifying the directional distribution of the radiation outputted from the body, i.e. the radiation propagating away from the body in a general output direction therefrom,
   wherein in both cases (i) and (ii) the said directional modification is in comparison with radiation at the same output of the body but in the absence of the said extraction structure(s) applied thereto.

In some cases the extraction structure may even directionally modify incoming or incident or input excitation radiation which enters the body of radiation converting monocrystalline material, e.g. spatially redistribute the radiation in the body of radiation converting monocrystalline material such as to increase the energy or intensity of or modify the directionality of the extracted radiation. In some cases the extraction structure may even directionally modify radiation generated or propagating within the body of radiation converting monocrystalline material such as to increase the energy or intensity of or modify the directionality of that extracted radiation.

Thus, in general terms the principle of applying the extraction structure to the body of radiation converting monocrystalline material which underpins many embodiments of the invention may be for the purpose of and such as to, for at least one wavelength (or range of wavelengths) of the radiation at the output of the body of radiation converting material, modify the directional distribution (i.e. to redistribute energy or intensity of the radiation propagating in various directions, or to change the directions of propagation, or to change the directions of propagation and redistribute energy or intensity of the radiation propagating in such new directions) of the radiation at the output of the body of radiation converting monocrystalline material, and/or to increase the energy or intensity of the radiation at the output of the said body of radiation converting monocrystalline material in at least one direction of propagation, compared to the directional distribution of and/or the energy or intensity in any given direction of the radiation at the output, preferably at that said output, of the body of radiation converting material in the absence of such an extraction structure. That directional modification occurs through interaction or interactions of radiation entering and/or propagating within and/or exiting the body with the one or more extraction structures applied to the one or more surfaces of the body.

In embodiments of the invention the extraction structure may be applied to at least one surface of the body of radiation converting monocrystalline material by virtue of being put into any suitable radiation-communicating or radiation-transmitting relationship with the said surface, that is to say by virtue of being arranged in any effective manner in which radiation exiting and/or entering and/or propagating within the body of radiation converting monocrystalline material can simultaneously or subsequently enter and pass through, or be reflected or transmitted from, the extraction structure. In some embodiments the extraction structure may be arranged in contact with the said surface, preferably such that at least one or more portions of the extraction structure abut or are in contact with or are contiguous with the said surface. In some embodiments such abutment, contact or contiguity may be achieved or enhanced by virtue of the extraction structure, or at least one or more portions thereof, being bonded, affixed or joined to, or united with, or arranged so as to be integral with, the said surface.

In some embodiments of the invention the radiation converting monocrystalline material may comprise or be a luminescent material. The luminescent material preferably comprises at least one luminophore, i.e. at least one atom, molecule, functional group or species comprising one or more such atoms, molecules or functional groups, which exhibits luminescence. Such luminescence may occur through any known mechanism, e.g. chemiluminescence, electroluminescence, photoluminescence (e.g. fluorescence or phosphorescence), radioluminescence, thermoluminescence, mechanoluminescence, etc.

In other embodiments the radiation converting monocrystalline material may comprise or be a scintillator material. The scintillator material preferably comprises at least one atom, molecule, functional group or species comprising one or more such atoms, molecules or functional groups, which exhibits scintillation upon excitation by radiation, especially high energy radiation, e.g. ionising radiation or particularly high energy electromagnetic radiation. Such scintillation, i.e. re-emission of absorbed energy in the form of small flashes of light corresponding to incidence of individual particles, is thus intended herein to be considered as a sub-category of the broader concept of luminescence.

In general, in embodiments of the invention the optical element may be, or may be alternatively termed, a radiation conversion element or radiation conversion optical element.

In some embodiments of the invention the radiation converting monocrystalline material may comprise a monocrystalline complex oxide with a composition according to the following general formula (I):

$$P_xQ_yO_z{:}R \qquad (I)$$

in which:
P is one or more elements selected from Gd, Lu, Tb, Y, Pb, Zn, Ca, Cd, Bi, La;
Q is one or more elements selected from Al, Ga, Si, Sc, W, Ge, B;
O is the element oxygen;
x and y are each independently a positive integral or non-integral number;
the ratio x/y is in the range from about 0.44 to about 2.55;
z is an integral or non-integral number, preferably in the range from about 2.5 to about 12.5;
R is at least one doping element selected from lanthanides and/or metals, preferably transitional metals, e.g. at least one or more of Ce, Pr, Nd, Yb, Sm, Eu, Dy, Mn, Mg, Zr, Cu, Cr, Ti; and
the content of R in the material is in the range from 0 to about 20 mol %.

In some embodiments the above complex oxide material may be selected from any one of the structural groups represented by garnets, orthosilicates, perovskites or pyrosilicates. In accordance with this definition, in such embodiments, in the above-defined compositional formula (I):
x may be an integer selected from 1, 2 or 3;
y may be an integer selected from 1 or 4 or 5; and
z may be an integer selected from 3, 4, 5 or 12;
wherein the aforementioned values of x, y and z are defined in the absence of any R, and if R is present then it may replace a proportion of, preferably a minor proportion of, at least one of, optionally either one of or even both of, the said defined amounts of P and Q present.

Some specific examples of the preceding complex oxide materials may include: YAP, YSO, YAG, LYSO, LPS, sapphire and their doped analogues in which R is present and replaces a proportion of at least one of P and Q.

In some embodiments, in the above-defined compositional formula (I):
x may be in the approximate range 0<x≤3;
y may be in the approximate range 0<y≤5.

In some embodiments, in the above-defined compositional formula (I):
the ratio x/y may be in the range from about 0.6 to about 2.0.

For example, for garnet-type structures the ratio x/y may be about 0.6, and for many silicate-type structures the ratio x/y may be about 2, whereas for perovskite-type structures the ratio x/y may be about 1, for certain silicate-type structures and germanate-type structures the ratio x/y may be about 0.75, and for certain other silicate-type structures and tungstate-type and borate-type structures the ratio x/y may be about 1.

In some embodiments, in the above-defined compositional formula (I):
R may be substantially absent altogether (in which case the complex oxide material may be undoped) or, more preferably, one or more species of doping element R may be present in a total amount of up to about 20 mol %.

In some such embodiments including one or more elements R as a doping species, atoms of the one or more doping species R may, or may notionally, replace or substitute a proportion of, preferably a minor proportion of, one or other of, or even some of both of, P and Q in a generally predefined composition of a given structure (e.g. garnets, orthosilicates, perovskites or pyrosilicates, etc) without any R present. Thus, for example in the case of doping with Ce, Pr or Dy a proportion of P may be replaced thereby, whereas in the case of doping with Mg, a proportion of Q may be replaced thereby. And in the case of doping with Mn, a proportion of either or both of P and Q may be replaced thereby, the identity of whichever of P and Q is replaced depending on the valence state of the Mn (which may be present as $Mn^{2+}$, $Mn^{3+}$ or $Mn^{4+}$).

Generally, in many embodiments, in the above-defined compositional formula (I) for the complex oxide material:
where R is Ce and/or Pr, the Ce and/or Pr may be present in a total amount of from about 0.05 to about 0.5 mol %;
where R is one or more of Nd, Yb, Sm, Eu, Dy, Mn, Mg, Zr, Cu, Cr, Ti, the Nd, Yb, Sm, Eu, Dy, Mn, Mg, Zr, Cu, Cr and/or Ti may be present in a total amount of up to about 10 mol %, e.g. up to about 5 mol %, or possibly up to about 4 mol %.

In some embodiments a preferred range of amounts of the doping species R which is present may depend on the identity of the basic, undoped, complex oxide material itself, i.e. the identities of P and Q and the values of x, y, and z.

Thus, some examples of the above complex oxide materials which may be suitable for use in embodiments of the invention may include:
YAG:Ce,Pr, in which YAG is doped with Ce and/or Pr in a total amount of from about 0.05 to about 0.35 mol %;
YAP:Ce,Pr, in which YAP is doped with Ce and/or Pr in a total amount of up to about 1 mol %;
YSO:Ce,Pr, in which YSO is doped with Ce and/or Pr in a total amount of from about 0.02 to about 0.25 mol %;
YAG:Ti,Mn,Eu or YAP:Ti,Mn,Eu or YSO:Ti,Mn,Eu, in which the YAG or YAP or YSO is doped with one or more of Ti, Mn and/or Eu in a total amount of up to about 10 mol %;
YAG:Cu or YAP:Cu or YSO:Cu, in which the YAG or YAP or YSO is doped with Cu in a total amount of up to about 4 mol %.

In some embodiments the doping species R may comprise elements from one or more of any of the following groups of R species:
(i) Ce and/or Pr,
(ii) one or more of Nd, Yb, Sm, Eu, Dy, Mn, Mg, Zr, Cr, Ti,
(iii) Cu,
the said elements from any one of said groups (i), (ii) and (iii) optionally being present in combination with elements from any one or more other of said groups (i), (ii) and (iii).

In some other embodiments of the invention the radiation converting monocrystalline material may comprise a monocrystalline sesquioxide with a composition according to the following alternative general formula (II):

$$S_{s-t}O_u:T_t \qquad (II)$$

in which:
S is one or more elements selected from Al, Lu, Gd Tb, La;
O is the element oxygen;
s is a number in the range from about 0.9 to about 2.5;
t is a number in the range from 0 to about 1;
u is a number in the range from about 2.8, to about 3.2; and T is at least one doping element selected from lanthanides and/or transitional metals, e.g. at least one or more of Ce, Eu, Pr, Yb, Nd, Er, Tm, Ti, Mn.

In examples of the above sesquioxides the doping element T may be present or may be absent altogether (in which latter case the parameter t is 0). Where T is present, the parameter t may be a number in the range of from about 0.01 to about 1.

In some examples of the above sesquioxides the parameter u may typically be about 3.

In practical embodiments of the invention the radiation converting monocrystalline material may comprise, in addition to the above-defined complex oxide per se according to compositional formula (I) or the sesquioxide per se according to compositional formula (II), one or more impurities in a total amount of e.g. up to about 10ppm (weight basis of the total material), preferably up to about 1 or 2 ppm, or more preferably up to about 0.5 or 0.8 ppm. Examples of such impurities which may be tolerated in such minor amounts may include elements such as Fe, as well as other elements which may be present naturally in the raw materials from which the monocrystalline materials are manufactured, or are remnant therein as a result of the particular manufacturing or post-production processes used.

The radiation converting monocrystalline material used in embodiments of the invention may be manufactured by any suitable known process or combination of processes, examples of which are widely documented in the art and examples of which manufactured materials are readily available from various industrial and commercial sources.

In embodiments of the invention the body of radiation converting monocrystalline material may have a wide variety of physical shapes and/or configurations. Examples of suitable shapes and/or configurations may include bodies in the form of one or more plates, wafers, lenses, rods, prisms, cuboids, or any suitable rotationally symmetrical shape, e.g. cylinder, cone.

In preferred embodiments, however, the body of radiation converting monocrystalline material may be in the form of a generally planar or substantially planar plate, platelet or sheet. That is to say, it may have a length and/or width dimension which is substantially greater than, e.g. at least about 50 or 60 or 70 or 80 or 90 or 95% greater than, its thickness dimension. In embodiments such plates, platelets, or sheets may be shaped, formed or cut so as to have any suitable or desired shape as viewed normal to the general plane thereof, for example generally or substantially rectangular, square, circular, elliptical, polygonal (e.g. triangular), any geometrical minor variants of the aforementioned basic shapes, or even a complex shape comprising elements of any of the aforementioned basic shapes, e.g. star-shaped. Such shaped or formed or cut shapes of such plates, platelets or sheets may or may not substantially correspond to, or be the same as or be geometrically similar to, the corresponding (i.e. as viewed on the same normal) shape of the body of radiation converting monocrystalline material.

In embodiments of the invention the extraction structure may be applied to at least one surface, face or side, optionally a plurality of surfaces, faces or sides, of the body of radiation converting monocrystalline material. In embodiments in which only one surface, face or side of the body of radiation converting monocrystalline material is provided with the extraction structure, one or more individual such extraction structures may be applied to that said one surface, face or side. However, in embodiments in which a plurality of surfaces, faces or sides of the body of radiation converting monocrystalline material are provided with the extraction structure, each said surface, face or side may be provided with at least one such extraction structure, wherein the form, structure and properties of the extraction structure(s) on each said surface, face or side are independently selected from those of the extraction structure(s) on any other one of the said surfaces, faces or side.

Each said surface, face or side of the body of radiation converting monocrystalline material having the, or a respective, extraction structure applied thereto may independently be, constitute, comprise or include a surface which is an output or an input surface of the body via which radiation may exit or enter the body.

The said surface(s), face(s) or side(s) of the body of radiation converting monocrystalline material may preferably constitute one side of an interface of the body at which, in use, radiation would undergo total internal reflection (TIR) were it not to be for the presence of the extraction structure thereon. Thus, in such embodiments the presence of the extraction structure applied to the said at least one surface, place or side of the body of monocrystalline material may reduce or at least partially eliminate or ameliorate the level or degree to which TIR occurs at such an interface, thereby modifying or enhancing the directional radiation transmission and/or dissemination characteristics of the said surface(s), face(s) or side(s) of the body.

In embodiments of the invention the extraction structure may comprise at least one micro- or nano-structural or thin-film based optical structure applied to at least one surface, face or side of the body of radiation converting monocrystalline material with which radiation exiting and/or entering and/or propagating within the body of radiation converting monocrystalline material interacts.

In some embodiments the or each optical structure may comprise any number of, i.e. one or more, or even a plurality of, layers, each of which layers may have optical properties or one or more optical functions which may be the same as or different from the optical properties or function(s) of any other layer in the optical structure. For example, in some embodiments the or each optical structure may comprise just a single layer of optical material, whereas in other embodiments the or each optical structure may comprise a plurality of, e.g. two, three or even more than three, layers of optical material, each of which layers may have optical properties or function(s) which may be the same as or different from any other layer in the or each optical structure.

In some embodiments any such layer of the of each optical structure may itself comprise one or more sub-layers, each of which sub-layers may have optical properties or one or more optical functions which may be the same as or different from the optical properties or function(s) of any other sub-layer or layer in the or each optical structure.

Such optical properties or functions of any one or more layers or sub-layers of the optical structure(s) which form(s) the, or part of the, extraction structure may be selected from those having activity as any one or more of the following, or any combination of any two or a plurality of the following:
 a filter,
 a semi-transparent mirror,
 a reflective layer,
 an anti- (or non-)reflective layer,
 a refractive layer,
 a diffractive layer,
 an optical lens or an array of lenses or lenslets,
 an interference structure, e.g. a grating or an interference filter,
 an optical modulation layer, e.g. one that modulates amplitude, phase and/or polarization of radiation incident thereon or passing therethrough,
 a layer with a modulated, or locally modulated, refractive index (which term "refractive index" is to be understood as encompassing the definition of a "complex refractive index"),
 a surface relief layer, e.g. of any desired or suitable specific relief dimensions and/or geometry,
 a holographic layer.

In some embodiments the optical structure may comprise, in combination, a plurality of layers or sub-layers, one or more of which has/have a specific relief geometry and one or more of which has/have a specific locally modulated refractive index. In some such embodiments the said one or more of which layers or sub-layers may have both a specific relief geometry and a locally modulated refractive index in one and the same such layer or sub-layer.

In some embodiments the one or more layers and/or sub-layers of the optical structure may be formed from any suitable material. Examples of suitable materials may include various plastics materials, metals or metal alloys, dielectric materials, or any combination of any of the foregoing materials.

The thickness of the one or more layers and/or sub-layers forming the or each optical structure may collectively be for example from a few nanometres up to a few micrometres, e.g. from about 10 nm up to about 1 or 2 or 5 or 10 or 20 or 50 or 100 or 200 or 500 or 1000micrometres. Individual layers or sub-layers making up the overall said optical structure may therefore have thicknesses somewhat smaller than the aforementioned total or collective thickness, depending for example on the number of layers and/or sub-layers making up the optical structure. In embodiments where the optical structure comprises a relief structure, the total or collective thickness of such layers and/or sub-layers forming the optical structure may preferably be significantly, or even substantially, greater in scale than the dimensions of the relief itself, as is generally the case with known such types of optical relief structures.

The optical structure comprising such layers and/or sub-layers or materials may be applied to the relevant surface, face or side of the body of radiation converting monocrystalline material by any suitable technique, examples of which are well-known in the art and readily available and understood by the skilled person.

For example, layers or sub-layers comprising dielectric materials with diffractive relief may typically be applied by replication of a master relief, such as by heating into a thermoplastic layer (e.g. of PET, PC, PP, or suchlike), or alternatively (possibly more preferably for some embodiments) by UV replication or UV casting using UV-curable lacquers or polymers, or by other casting or moulding methods. Such a dielectric layer or sub-layer may optionally, if need be or if desired, be covered by one or more additional dielectric layers or sub-layers, for example by a vacuum deposition process.

On the other hand, metal layers or sub-layers may be applied typically by vacuum deposition.

In some practical examples, one or more metal layers or sub-layers may be applied on top of a relief layer or a portion of a relief layer, or alternatively on top of a set of layers or sub-layers without relief or a portion thereof, for instance in the case of an optical structure being or comprising an interference filter.

Layers or sub-layers with specific diffraction relief may for example be originated or formed using an optical or electron beam lithography process, in which a photo- or an e-beam-resist layer is initially used which has the required surface relief, which is dictated by the type of material and the optical geometry of the final product. Exposed relief is replicated into or onto a suitable material, for example glass, with surface or other relief. This glass is then used as a replication tool: a lacquer is applied between the luminophore or scintillator body (or any other radiation converting monocrystalline material body) and the glass. This sandwich is then lit by a UV beam to harden the UV lacquer. This technique is known generally as UV nano-imprint lithography.

In any such embodiments comprising a plurality of such optical layers or sub-layers making up the or the respective optical structure, any given pair of such layers or sub-layers may be directly attached, bonded, connected, united or applied to each other, or alternatively may be attached, bonded, connected, united or applied to each other via one or more intermediate layer(s), the or each such intermediate layer optionally being a layer with any of the above-listed optical properties or functions. Such layers or sub-layers may be so attached, bonded, connected or united by virtue of their formation or deposition or application process itself, or by use of any other suitable technique of attachment, bonding, connection or uniting, e.g. using an adhesive.

Likewise, in any such embodiments comprising a plurality of any of the aforesaid optical structures, any given pair of such optical structures may be directly attached, bonded, connected, united or applied to each other, or alternatively may be attached, bonded, connected, united or applied to each other via one or more intermediate layer(s), the or each such intermediate layer optionally being a layer with any of the above-listed optical properties or functions. Such layers may again be so attached, bonded, connected or united by virtue of their formation or deposition or application process itself, or by use of any other suitable technique of attachment, bonding, connection or uniting, e.g. using an adhesive.

Generally speaking, where a layer or sub-layer forming the, or a component of the overall, optical structure is a relatively thin layer, e.g. of the order of tenths of a nanometre up to tens or hundreds of nanometres, it may be preferred to form or apply it by use of a process of vacuum deposition, e.g. including vacuum evaporation or vacuum sputtering. On the other hand, where a layer or sub-layer forming the, or a component of the overall, optical structure is a relatively thick layer, e.g. typically of the order of tens of nanometres up to hundreds of micrometres, it may be preferred to form or apply it by use of a process of UV nano-imprint lithography, e.g. UV casting, moulding or high temperature embossing. Practical examples of such processes, and apparatus for performing such processes, are well-known in the art and readily available to the skilled person.

Thus, in some typical embodiments, where the body of radiation converting material is a generally planar plate, platelet or sheet having a cuboidal three-dimensional shape, at least one of its major faces (which may typically be at least an exit face) may have applied thereto a said extraction structure. Optionally both of its major faces (which may typically both be at least exit faces) may have a respective extraction structure applied thereto. Further optionally, it may be possible for either or both of its minor faces (which may also constitute at least exit faces) also to have applied thereto one or more respective extraction structures.

However, it is possible that any one or more of the aforementioned major and/or minor faces of the body may constitute or comprise an entry face thereof, for example depending on the function of the optical element and the radiation to be converted and/or outputted by it. The extraction structure applied to any one given major or minor face of the body may be independently selected so as to be the same as or different in construction and/or optical function from the extraction structure applied to any other given major or minor face thereof.

In certain embodiments in which the extraction structure comprises an optical structure comprising a plurality of layers or sub-layers, at least one of the said layers or sub-layers may be constituted by a surface region, portion or layer of the said body of radiation converting monocrystalline material itself. Such a surface region, portion or layer of the said body of radiation converting monocrystalline material may for example comprise a profiled surface of the said body on a surface, face or side thereof via which radiation exits from the body.

Embodiments of optical element in accordance with the present invention may be used as converters of, or for or in the conversion of, a wide range and variety of forms of radiation, wherein the body of luminescent radiation converting material acts or functions to convert one or more types or frequencies/wavelengths of radiation incident thereon or passing therethrough or generated therein into one or more other types or frequencies/wavelengths of radiation, wherein as the latter radiation exits or is outputted from the body it is directly and/or indirectly directionally modified by the extraction structure(s) applied to the one or more surface(s), face(s) or side(s) of the body.

For example some embodiments of the invention may be useful in the conversion of electromagnetic radiation from one frequency/wavelength or range of frequencies/wavelengths to another, different frequency/wavelength or range of frequencies/wavelengths, especially within the visible region of the spectrum. Thus embodiments of the invention may be particularly useful for directionally modifying converted radiation which is visible light. Of course, however, embodiments of the invention may be applicable to the directional modification of electromagnetic radiation of frequencies/wavelengths outside, e.g. to either side of, the visible range.

An example of the above application is optical elements for lighting purposes, for example especially the field(s) of LED and/or LD technology. Another example is optical elements for the detection of ionizing radiation, for example X-rays, $\alpha$, $\beta$ and $\gamma$ rays, electrons, E-UV (or X-UV), in scintillating monocrystals forming the body of radiation converting material of the optical element. Such scintillating monocrystals generally have high refractive indices and there is therefore a general requirement to increase the light output exiting from such crystals and/or to direct it in particular desired directions, as is the fundamental aim of embodiments of the present invention.

In some embodiments of luminophore with an optical structure applied at least on one light-entering and/or light-exiting surface, it may be possible to convert light to provide an output with especially uniform colour parameters such as CCT and CRI, and with such an advantage may also come a desirable change in overall distribution of the light intensity or energy. Such an optical structure applied on the luminophore may also serve as a light concentrator, which focuses or defocuses the light from a forward direction. As a consequence, additional optical elements applied over LED or LD modules for example in order to meet application requirements may be made more compact and more efficient, or even may be completely eliminated altogether.

In practical implementation of embodiments of the invention various parameters of the extraction structure may, if or as desired or necessary, be optimised in order to tailor the specific output and/or input (as the case may be) characteristics of the optical element such that a desired or required or appropriate degree or nature of directional modification of the radiation exiting and/or entering (as the case may be) the body of radiation converting monocrystalline material occurs.

In many embodiments such parameter optimisation may comprise any one or more of the following:

- selecting or adjusting a particular desired or appropriate diffraction property of the extraction structure, e.g. by recalculating the diffraction pattern in order to give a specific desired output and/or input (as the case may be) of the diffracted radiation;
- selecting or adjusting a particular desired or appropriate interference property of the extraction structure, e.g. by recalculating the interference pattern in order to give a specific desired output and/or input (as the case may be) of the radiation having undergone interference;
- changing the identity, species, nature or structure of the optical material of any one or more layers from which the extraction structure is formed;
- changing the thickness of the optical material of any one or more layers from which the extraction structure is formed;
- where the extraction structure comprises one or more layers with a surface relief structure, changing the shape, size, height and/or distribution of the relief features in order to give a specific desired output and/or input (as the case may be) optical function applied to the radiation passing through the relief structure;
- where the extraction structure has a definable focal length, changing that focal length;
- where the extraction structure is a diffraction grating, changing the depth and/or the period and/or modulation pattern (e.g. sinusoidal, sawtooth, etc) of the diffraction structure of the grating, e.g. as a result of which a diffraction chromatic dispersion effect may be suppressed, or which may lead to an improved diffraction efficiency (i.e. lower losses for a given optical function).

The optical design techniques by which such parameter optimisations or adjustments may be carried out or effected will be well within the general knowledge and established practical skills of persons skilled in the present art, including by use of commercial or custom optical modelling or design software (e.g. ray-tracing software, diffraction grating modeling software, thin-film coating design software, etc).

However, by way of some specific practical examples of the ways in which such parameter optimisations may be effected, the following examples may be mentioned by way of non-limiting illustration only:

In cases where the extraction structure comprises a diffraction grating or a plurality of diffraction gratings, the grating efficiency with respect to a particular wavelength range and/or angles of incidence of radiation transmitted through or reflected from the grating structure may be optimised. This may be done by varying one or more parameters of the grating, typically any one or more of the following: the shape of the modulation profile (e.g. the shape of the grating relief, which may for instance be generally sinusoidal, sawtooth, etc), the grating thickness or depth, and the grating period. Through the use of optical modelling or design software the grating efficiency and the direction of radiation at the grating exit may be calculated, based on the chosen input parameters, i.e. the grating parameters and the parameters of the incident radiation. A set of gratings parameters for which a desired output radiation intensity and propagation direction are achieved may define an optimum or preferred grating.

Similarly, in cases where an extraction structure comprises an array of features, such as microlenses, pillars, pyramids, etc, the geometrical parameters of such shapes (i.e. their size, height, curvature, etc) may be varied, and through the use of optical modelling or design software optimum parameters for given features may be determined based on an optimum optical response of the extraction structure to the incident radiation (e.g. a maximum level/amount/intensity/energy of extracted light, light extracted into a preferred direction, etc).

Various thin-film coating design software packages are available for use in designing interference-type extraction structures, such as single- or multi-layer thin film coatings. They may be optimised to enhance reflectivity or transmission of a specific wavelength range and/or a specific range of angles of incidence, and this optimisation may typically be done by the relevant design software if the required performance parameters and materials for the single- or multi-layer film and the initial conditions of incident radiation are entered as input parameters.

In cases where such a single- or multi-layer film is used on an input surface of the body of radiation converting monocrystalline material, it may be designed as a reflective structure reflecting a specific portion of the radiation generated in the body towards the output surface thereof, therefore increasing the amount of output radiation outputted from the body. For application to the output surface of the body an interference-type extraction structure may thus be designed as an anti-reflective structure, increasing the amount of extracted (i.e. output) radiation. Such a structure may be applied either on an output surface of the body of radiation converting monocrystalline material directly, or indirectly thereon as a sub-layer or as a layer on top of another extraction structure (e.g. a surface relief structure).

Thin-film coating may also be represented as a purely reflective or absorptive coating.

Single- or multi-layer coatings may be applied to any particular or desired surface selectively, for example through a mask, or applied to specific portions or features of (or portions of features of) a relief structure via a directional coating process. Alternatively such coatings may be selectively removed from the coated surface, for example by selective etching, ion milling, etc. Relief structures coated selectively (e.g. with interference-, reflective- or absorptive-type structures) may be designed such that they improve directionality of the extracted radiation (i.e. enhance radiation in one or more preferred directions).

In some embodiments it may be desirable to permit only a portion of radiation actually illuminating the body of radiation converting monocrystalline material, e.g. illuminating it at an input side thereof, to enter the body. In such cases an extraction structure applied to an input surface of the body may be configured to transmit only a portion of converting radiation illuminating or entering the body.

Such an extraction structure (or any of its sub-layers) may selectively transmit desirable spectral portion(s) of the radiation and reflect and/or absorb other spectral portion(s) of the radiation illuminating the body of radiation converting monocrystalline material. Such an extraction structure (or any of its sub-layers) selectively transmitting one or more particular or respective spectral portions of the radiation may for example be designed in the form of an interference filter, absorption filter, partially transmitting mirror, high frequency diffractive structure, and suchlike.

Limiting the amount of radiation entering the body of radiation converting monocrystalline material may, for example, decrease the heat accumulation within the body or cause the luminescence process to occur only at specific spectral region(s) of the illuminating radiation or limit radiation of some wavelength(s) or wavelength region(s) at the output of the body.

An extraction structure (or any of its sub-layers) applied to an input surface of the body of radiation converting monocrystalline material may alternatively (or even additionally) be configured to selectively accept only a portion of illuminating radiation propagating at certain angles. Such a structure (or any of its sub-layers) may be designed, for example, as a set of absorbing (or partially absorbing) planes periodically or quasi-periodically spaced within the material, thereby forming a specific layer of the extraction structure. These planes may be oriented parallel to the normal vector of the given layer or may be tilted relative to the normal vector. Depending on the design of the characteristics or parameters of the absorbing or partially absorbing planes, such as plane spacing (i.e. distance between planes), their height (i.e. plane dimension throughout the layer thickness) and their tilt angle, such a layer may transmit only radiation propagating at certain propagation angles. The absorbing features within the said layer may not be limited to planes only, but may be designed as objects with a different shape, such as, for example, extruded triangles or rectangles (or any combination thereof), and suchlike, which may be periodically or quasi-periodically distributed across the entire layer (or its portion).

Absorbing features defined above may for example be recorded in a photosensitive material (such as silver halide emulsion) or may comprise surface relief, for example a grating with a high aspect ratio rectangular profile where the ridges are filled with an absorbing material.

The angular selection of input radiation may be advantageous for example in direction sensing applications.

In some embodiments it may be desirable to modify the direction or change the angular distribution of input radiation (typically converting radiation) by use of an extraction structure applied to an input surface of the body of radiation converting crystalline material. In such cases the entering converting radiation may have some directional characteristics, e.g. characteristics similar to a collimated or partially collimated beam, spherical beam, cylindrical beam, etc.

Such an extraction structure modifying the angular distribution of the input radiation may be configured to allow the entering converting radiation to propagate over or through longer distance(s) within the body to increase its interaction time with luminescence centres and/or increase the probability of luminescence events and/or to reduce or eliminate converting radiation at the exit of the body output (for example, converting radiation propagating within the body at higher propagation angles may not reach the output surface of the body, or may be totally reflected from the output surface of the body, or the reduction of the amount of converting radiation exiting the body may be used to modify spectral characteristics of the overall radiation at the body output).

The aforementioned extraction structure (or any of its sub-layers) may, for example, comprise a refractive structure (e.g. a set of micro-prisms distributed along the input surface of the body), a diffractive structure (e.g. a diffraction grating), a reflective structure (e.g. a set of micro-mirrors), or some other like type of optical structure. The propagation direction of radiation entering the radiation converting crystalline material body through the said extraction structure may be optimised, for example, by modification of the geometrical parameters and/or material properties (e.g. refractive index) of the features of such an extraction structure.

In some embodiments it may be desirable to illuminate the body of radiation converting crystalline material non-homogenously by the converting radiation in a form of periodically, or quasi-periodically, or randomly spaced strips (lines) or columns (dots), or suchlike. This may be achieved by use of an extraction structure applied to the input side of the material body. Such an extraction structure may comprise a mask (e.g. a set of slits or apertures letting only a portion (or portions) of converting radiation into the body), or a relief structure (e.g. a periodic relief surface structure with profile features in the shape of a very steep triangle profile, coated with a reflective layer and having openings at the bottom of triangular grooves letting incoming radiation enter the body at specific locations so as to create non-homogeneous illumination of the radiation converting monocrystalline material body), or a set of micro-lenses (e.g. focusing incoming converting radiation in localised spots within the radiation converting monocrystalline material body).

In some embodiments the extraction structure (or any of its sub-layers) may comprise a lens or Fresnel-type lens of any suitable type. Such an extraction structure may be applied on an input and/or an output side (or any portion of either thereof) of the radiation converting monocrystalline material body, typically with a result of modifying a divergence (or convergence) angle of the radiation (or a portion thereof) entering and/or exiting the body, assuming such radiation (or a portion thereof) has a certain degree of directionality (e.g. is collimated, partially collimated, diverging, converging, etc.).

In certain embodiments an extraction structure (or any of its sub-layers) applied to an input surface of the body may act as a reflector of converted radiation originated within the body of radiation converting monocrystalline material and propagating towards the input surface of the body, so as to modify its propagation direction towards the output surface with a goal of increasing an amount of the extracted radiation at the body output. Such an extraction structure may comprise an interference layer (e.g. a dielectric mirror acting, for example, as a spectrally and/or angularly selective mirror), or a partially reflective mirror, or a relief structure with retro-reflective features (e.g. micro-lenses, corner reflectors or the like), or a combination of any of the aforesaid. Spectrally selective mirrors may, for example, be designed such as to enhance certain spectral portion(s) of the radiation at the output of the body of radiation converting monocrystalline material.

In some embodiments an extraction structure may be applied on one or more than one side surfaces of the body of radiation converting monocrystalline material. Such an extraction structure (or any of its sub-layers) may act as a deflector of the radiation propagating within the said body towards the side surfaces and deflects it towards the output surface, in order to increase radiation at the output of the body. In such a case the extraction structure may, for example, comprise a diffraction grating, or micro-mirrors, or micro-prisms, or one or more reflective coatings, etc (or a combination of any of the aforesaid), with characteristic features preferably designed in such a way that they diffract or reflect the incident radiation towards the output surface of the body.

Extraction structure(s) applied to the side surface(s) of the radiation converting monocrystalline body may also comprise a reflective structure which may act as a reflector of the converting radiation (which has reached the side surface(s)), thereby reflecting it back into the body, thus enabling more interactions of conversion radiation with luminescence centres in order to increase the amount of converting radiation, and therefore also increasing the amount of radiation at the output of the body. Suitable reflective structures may for example include dielectric mirrors (e.g. spectrally selective mirrors), metallic reflective coatings, corner reflectors or other relief structures with similar functions.

In some embodiments an extraction structure may be applied to the output side of the radiation converting monocrystalline body. In such cases its typical primary function may be to increase the amount of converted radiation which originates in the body and is usually omnidirectional. Such extraction structures may comprise one or more relief structures, which may be of various shapes (e.g. arrays of pyramids, pillars, cones, micro-lenses, etc), or may be in the form of diffraction gratings, antireflective structures, for example of a "moth eye" or thin-film types, etc, with their characteristic parameters (e.g. geometry, thin film layer structure, etc) preferably designed such that they act to modify conditions of reflection at the output surface of the body of radiation converting monocrystalline material in order to suppress total internal reflection or other Fresnel-type reflections and so enable more radiation to exit the body.

In certain embodiments a reflective structure comprised in an extraction structure applied to an output surface of the body of radiation converting monocrystalline material may be designed with spectral selectivity in order to enhance or suppress certain spectral portions of the radiation exiting the body or in order to reflect converting radiation back into the body, to allow more interactions of converting radiation with luminescence centres to occur, thereby increasing the amount of converted radiation and therefore also the amount of converted radiation at the output of the body.

Extraction structures applied to an output surface of the radiation converting monocrystalline material body may also be designed such as to directionally modify the output radiation, so that it propagates in desired direction(s) (i.e. with a desired angular distribution). Some such extraction structures may be designed in a similar manner to extraction structures applied to an input surface and allowing only certain directions of input radiation into the radiation converting monocrystalline material body. Such an extraction structure (or any of its sub-layers) may be designed, for example, as a set of absorbing (or partially absorbing) planes periodically or quasi-periodically spaced within the material, forming a defined or discrete layer of the extraction structure and oriented parallel to the normal vector of the given layer or being tilted relative to the normal. Depending on the design of the characteristics or parameters of the absorbing or partially absorbing planes, such as plane spacing (i.e. distance between planes), their height (i.e. plane dimension throughout the layer thickness) and their tilt angle, such a layer may transmit only radiation propagating at certain propagation angles.

The absorbing features within such layer(s) may not be limited to planes only, but may be designed as objects with any other suitable, but different, shape, such as, for example, extruded triangles or rectangles (or any combination thereof), which may for example be periodically or quasi-periodically distributed across the entire layer (or any portion thereof).

In some embodiments the above-mentioned planes or other features may also be designed such that one of their sides is absorptive and the other is reflective. As an example of this, a relief sawtooth profile may be selectively coated on the tilted facet first by a reflection coat followed by an absorptive coat. Optionally the relief structure may be buried in another layer of material (e.g. epoxy, UV polymer, etc). The absorptive portion of the coating prevents the radiation from exiting in certain directions, while a reflective portion of the coating prevents unnecessary absorption of radiation which exits at other than suppressed directions.

Absorbing features discussed above may for example be recorded in a photosensitive material (such as silver halide emulsion) or comprise surface relief, for example a grating with high aspect ratio rectangular profile where the ridges are filled with an absorbing material.

In some embodiments the radiation converting monocrystalline material may be illuminated non-homogeneously. The non-homogeneous illumination of the body (e.g. referred to in some previous embodiments) by converting radiation may also create localised sources of converted radiation. Such sources may typically be distributed within the body in a corresponding manner to the distribution of non-homogeneous illumination (for example in the form of an array of focal points, or an array of columns, etc). The radiation from the localised sources may be collected by an extraction structure applied to an output surface of the body, while such a structure may comprise features such as a set of micro-lenses having the same or a similar distribution across the output surface as the distribution of the localised sources, and they may be designed such that they are able to collimate or partially collimate or reduce multi-directionality of the radiation at the output of the body. In some embodiments the entire set of features (e.g. the said micro-lens array) may be laterally offset relative to its nominal location (i.e. above the radiating sources) in order to angularly offset the direction of the radiation at the output of the body.

In a second aspect of the present invention there is provided a method of at least partially converting radiation incident on or passing through or generated within or propagated within an optical element, comprising:
  providing an optical element according to the first aspect of the invention or any embodiment thereof; and
  applying onto or passing through or generating or propagating within the body of radiation converting monocrystalline material radiation to be converted;
  whereby radiation exiting and/or entering and/or generated within and/or propagated within the said body of radiation converting monocrystalline material is directionally modified via interaction(s) with the said extraction structure applied thereto.

Embodiments of the preceding second aspect may correspond to any embodiments of the first aspect of the invention as defined above or herein.

In a third aspect of the present invention there is provided a method of directionally modifying radiation exiting and/or entering and/or propagating within an optical element comprising a body of radiation converting monocrystalline material, wherein the radiation is applied onto or passed through or generated within or propagated within the body of radiation converting monocrystalline material and at least partially converted by interaction(s) with the said body of radiation converting monocrystalline material, wherein the method comprises:
  providing an optical element according to the first aspect of the invention or any embodiment thereof; and applying onto or passing through or generating or propagating within the body of radiation converting monocrystalline material the radiation to be converted;

whereby the radiation exiting and/or entering and/or generated within and/or propagated within the said body of radiation converting monocrystalline material is directionally modified via interaction(s) with the said extraction structure applied thereto.

In a fourth aspect of the present invention there is provided radiation which has been directionally modified by virtue of having passed through or been generated or propagated within an optical element according to the first aspect of the invention or any embodiment thereof, or by having been subjected to a method according to either of the second or the third aspects of the invention or any embodiment thereof.

Embodiments of either of the preceding third or fourth aspects may correspond to any embodiments of the first aspect of the invention as defined above or herein.

Within the scope of this specification it is expressly envisaged that the various aspects, embodiments, examples and alternatives, and in particular the individual features thereof, set out in the preceding paragraphs, in the claims and/or in the following description and drawings, may be taken independently or in any combination. For example, features described in connection with one embodiment are applicable to all embodiments, unless expressly stated otherwise or such features are incompatible.

BRIEF DESCRIPTION OF THE DRAWINGS

Various embodiments of the present invention in its various aspects will now be described in detail, by way of example only, with reference to the accompanying drawings, in which.

DETAILED DESCRIPTION OF EMBODIMENTS
OF THE INVENTION

The essence of the present invention as exemplified by the various embodiments described herein and below lies in the application to at least one surface, face or side of the body of luminescent radiation converting monocrystalline material, e.g. a scintillator or luminophore, an, or a respective, extraction structure, which extraction structure is constructed and/or configured to directionally modify the radiation at the output of the body via interactions of the radiation entering and/or exiting and/or propagating within the body with one or more surface(s), face(s) or side(s) of the body to which the extraction structure is applied. In other words, the extraction structure effectively modifies the nature of the interface between the material of the body and the medium or environment external thereto and with which radiation exiting and/or entering and/or propagating within the body interacts having been at least partially converted as it passes through the body. Thus, the final output radiation exiting the body, having been directionally modified by the extraction structure, may as a result be directionally modified in an advantageous manner, especially in order to reduce or ameliorate the deleterious effects of TIR which would occur in the body were it not for the presence of the extraction structure thereon.

In many practical examples the body of radiation converting monocrystalline material may be in the form or shape of a thin plate or platelet, wafer, lens, rod, a rotationally symmetrical shape (e.g. cylinder or cone), or cuboidal body or a prism. The extraction structure may be simple or complex, and may comprise one or more layers, often a plurality of layers, in order that it applies a particular desired or appropriate optical function to the radiation interacting with it. That optical function is such as to provide (directly or indirectly) the output light or other radiation directionally modified, i.e. with desired intensities or energies and/or angular or spatial distribution (i.e. desired radiation characteristics thereof) as it emerges from the radiation converting monocrystalline material body with extraction structure(s) applied to any of its surfaces.

Figure 1:
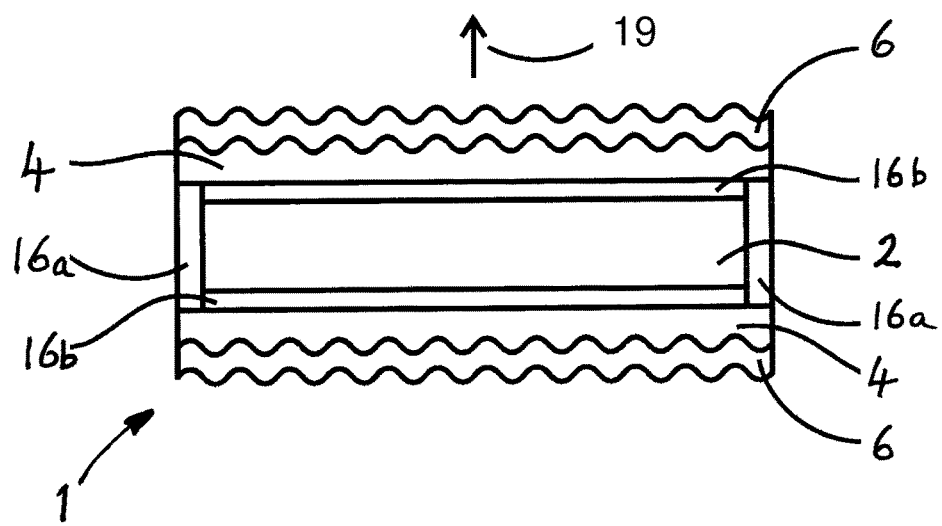
FIG. 1 is a schematic cross-sectional view of a first embodiment of an optical element in accordance with the present invention.

As exemplified in FIG. 1, one example basis for the optical element 1 may typically be a micro- or nano-structural or thin-film based extraction structure comprising a layer 4 having a particular desired optical function applied to the luminophore or scintillator body 2 on at least one face or side, preferably a major face or side, thereof. The layer 4 may have applied thereon or superposed thereover or superimposed thereon one or more additional layers 6, again having particular desired optical function(s) to appropriately directionally modify the radiation at the output 19 of the body 2 as a result of direct or indirect interactions of the said radiation with the said combined layers 4, 6 before it is extracted from the body 2.

The body 2 of radiation converting monocrystalline material is preferably of a luminescent material, e.g. a scintillator material in some embodiments. Many examples of such luminescent or scintillator materials are possible and widely known and available in the art, and many such examples of such materials which may be used in embodiments of the invention are defined and disclosed hereinabove.

If desired or appropriate, additional auxiliary layers 16a, 16b may optionally be pre- or under-applied on one or more of the major and/or minor faces or sides of the body 2, again each with a particular desired optical function.

Any or all of the applied layers 4, 6, 16a, 16b may have any desired or appropriate structure, configuration or optical function, all of which collectively govern the nature and/or extent or degree of the directional modification of the output radiation 19 as a result of exertion by the extraction structure as a whole on the radiation entering and/or exiting and/or propagating within the body and interacting with the extraction structure. Examples of such structures, configurations or optical functions include any one or more of (including any combination of two or more of) the following:

a filter,
a semi-transparent mirror,
a reflective layer,
an anti- (or non-)reflective layer,
a refractive layer,
a diffractive layer,
an optical lens or an array of lenses or lenslets,
an interference structure, e.g. a grating or an interference filter,
an optical modulation layer, e.g. one that modulates amplitude, phase and/or polarization of radiation incident thereon or passing therethrough,
a layer with modulated, or locally modulated, refractive index (including complex refractive index),
a surface relief layer, e.g. of any desired or suitable specific relief dimensions and/or geometry,
a holographic layer.

Any of the applied layers 4, 6, 16a, 16b may be overlaid uniformly or non-uniformly over the body 2 or a layer beneath the applied layer. Moreover, any such applied layer 4, 6, 16a, 16b may optionally be continuous or discontinuous, or e.g. patterned.

Figure 2A:
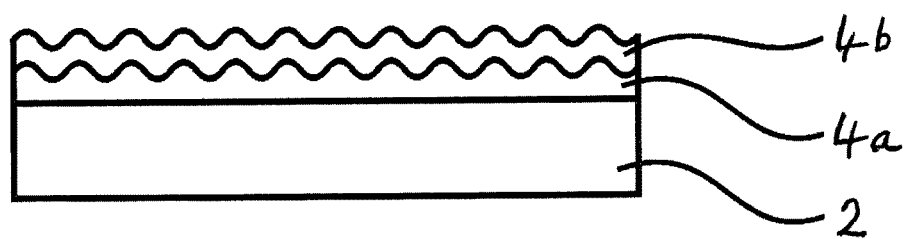
FIG. 2(a) is a schematic cross-sectional view of one example of a second embodiment of an optical element in accordance with the present invention.
Figure 2B:
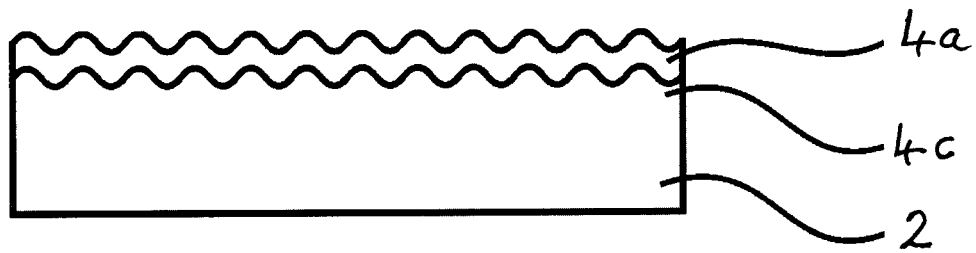
FIG. 2(b) is a schematic cross-sectional view of another example of a second embodiment of an optical element in accordance with the present invention.
Figure 2C:
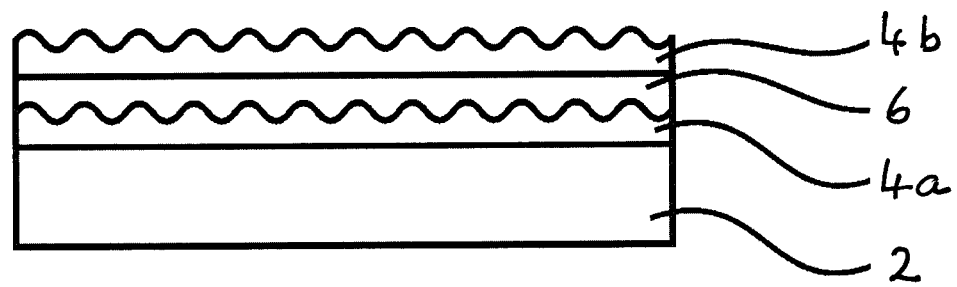
FIG. 2(c) is a schematic cross-sectional view of yet another example of a second embodiment of an optical element in accordance with the present invention.

The micro- or nano-structural or thin-film based extraction structure may comprise a single layer, as shown schematically in FIG. 1, or alternatively it may comprise a combination of a plurality of individual layers, which may be termed "sub-layers", as illustrated schematically in FIGS. 2(*a*), (*b*) and (*c*). In one example form, as shown schematically in FIG. 2(*a*), the various sub-layers 4a, 4b can be stacked directly on top of each other. Any of these sub-layers 4a, 4b may if desired themselves be coated with thin films or surfaces with protective and/or other optical functions, e.g. interference filters, semi-transparent mirrors, reflective or anti-reflective layers, in order to further modify or tailor the particular optical function(s) of the overall stacked layers.

In another example form, as shown schematically in FIG. 2(*b*), the micro- or nano-structural extraction structure may again comprise a plurality of upper 4a and lower 4c sub-layers, but this time the lower sub-layer 4c is actually formed by an exit surface region or portion of the body 2 of the element itself.

In another example form, as shown schematically in FIG. 2(*c*), instead of the various sub-layers being stacked directly on top of each other, they may instead be separated or interspersed by one or more other layers with particular selected one or more respective optical functions, e.g. one or more other interference filters, semi-transparent mirrors, reflective or anti-reflective layers, or suchlike. As shown in FIG. 2(*c*), the extraction structure in this example comprises sub-layers 4a and 4b separated by an intermediate layer 6 e.g. with a different optical function to that of either of the layers 4a and 4b.

Figure 3:
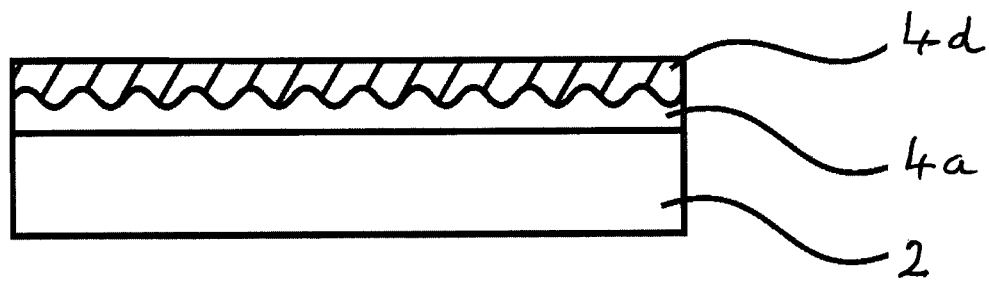
FIG. 3 is a schematic cross-sectional view of a third embodiment of an optical element in accordance with the present invention.

In general the overall micro- or nano-structural or thin-film based extraction structure or any one or more layers or sub-layers thereof may be constructed and/or configured so as to be capable of modifying or modulating to a desired degree one or more optical properties of light exiting the body 2, such as amplitude, phase and/or polarisation. For example, such an extraction structure may comprise at least one layer or sub-layer with a surface relief of a specific geometry, as shown schematically for instance in FIG. 1. Alternatively or additionally to the surface relief of a layer or sub-layer, its refractive index may be locally modulated, as shown schematically for instance in FIG. 3, which shows an example of an optical element consisting of a relief sub-layer 4a applied to a luminophore or scintillator body 2 and a superimposed sub-layer 4d thereon with a locally varying refractive index.

Figure 4:
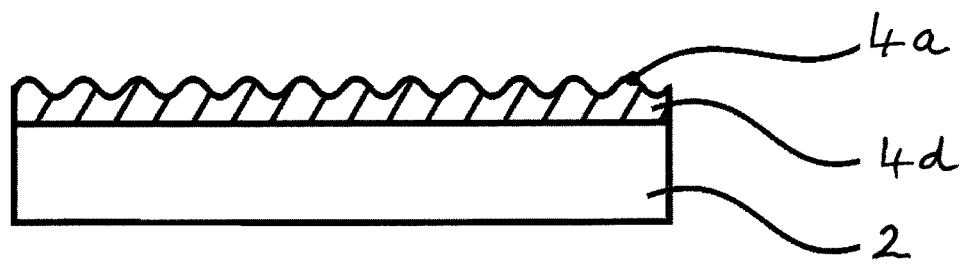
FIG. 4 is a schematic cross-sectional view of a fourth embodiment of an optical element in accordance with the present invention.

As illustrated schematically in FIG. 4, in another example form the micro- or nano-structural or thin-film based extraction structure may alternatively comprise a lower layer 4d with a varying refractive index and, at the same time, a surface layer 4a with a modulated surface relief of a specific geometry.

Figure 5:
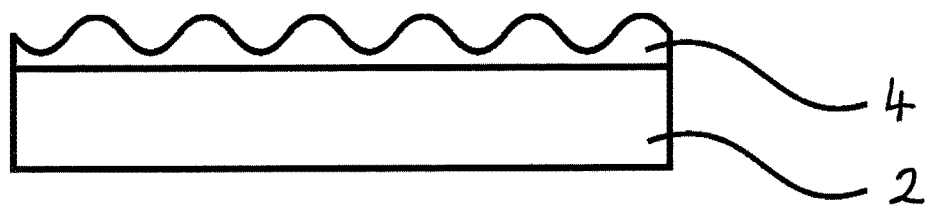
FIG. 5 is a schematic cross-sectional view of a fifth embodiment of an optical element in accordance with the present invention.

As illustrated schematically in FIG. 5, in another example form the exit surface of the luminophore or scintillator body 2 may be coated with, or otherwise have applied thereto, a thin layer of material with an extractive relief surface 4, which itself when designed employs the principle(s) of reflection and/or refraction and/or diffraction applied to radiation interacting with this layer to ensure effective extraction of the output luminescence emitted from the luminophore or scintillator body 2 as well as its angular redistribution preferably into the desired direction(s).

Figure 6:
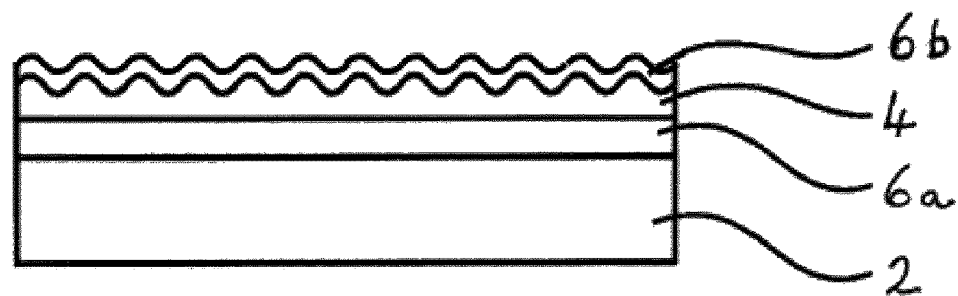
FIG. 6 is a schematic cross-sectional view of a sixth embodiment of an optical element in accordance with the present invention.

According to another example form, as illustrated schematically in FIG. 6, the surface of the luminophore or scintillator body 2 may be coated with, or otherwise have applied thereto, a plurality of superposed layers collectively making up the requisite extraction structure, which is composed of a layer of an interference filter 6a, a layer with a diffractive relief surface 4, and a layer of an output interference filter 6b, which layers collectively together when designed employ principle(s) of reflection and/or refraction and/or diffraction applied to radiation interacting with these layers to ensure effective extraction of the output luminescence emitted from the luminophore or scintillator body 2 as well as its angular redistribution preferably into the desired direction(s).

Figure 7:
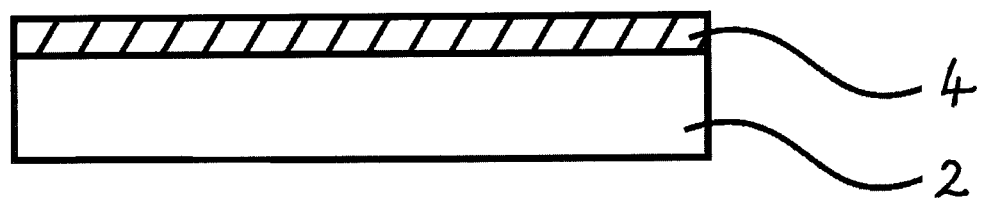
FIG. 7 is a schematic cross-sectional view of a seventh embodiment of an optical element in accordance with the present invention.

According to another expedient implementation, as illustrated schematically in FIG. 7, the surface of the luminophore or scintillator body 2 may be coated with a thin layer 4 of material with an extraction structure, which is composed of a material with a local modulation of the refractive index inside the layer 4 itself, e.g. a layer of photopolymer with a recorded volume diffraction structure. The extraction structure layer 4 itself may thus when designed employ the principle(s) of reflection and/or refraction and/or diffraction applied to radiation interacting with this layer to ensure effective extraction of the output luminescence emitted from the luminophore or scintillator body 2 as well as its angular redistribution preferably into the desired direction(s).

Figure 8:
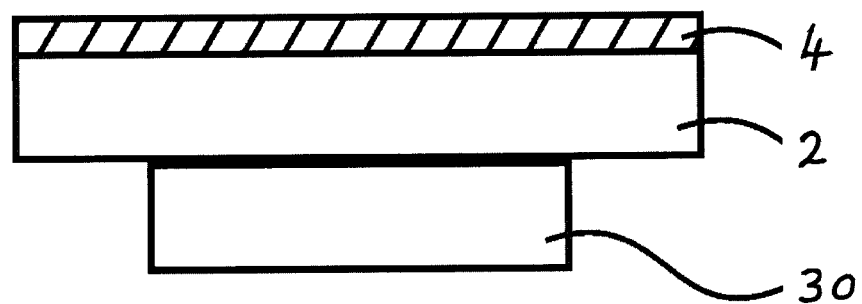
FIG. 8 is a schematic cross-sectional view of an eighth embodiment of an optical element in accordance with the present invention.

According to another example embodiment form, as shown schematically in FIG. 8, a radiation converter luminophore or scintillator body 2 in the shape of a plate is placed above a blue (for example) emitting LED 30, e.g. with a wavelength of 450 nm, and the extraction structure 4 applied on the exit face of the radiation converter body 2 which enables on the basis of the principle(s) of refraction and/or reflection and/or diffraction efficient extraction of the emitted output light radiation from the radiation converter body 2 and/or its angular redistribution preferably into the desired direction(s) and furthermore achieves a removal of a halo effect and independence CCT to an emission angle of the entire system.

In any or all of the example embodiments described above and illustrated in the drawings, increased levels or energies of light outputted from the luminophore or scintillator bodies in any given output direction, and/or directing of the output light into one or more particular desired directions may be optimised by appropriate optimisation of one or more of the structural and/or optical functional parameters of the overall extraction structure or one or more of the layers of which it is composed. For example, appropriate selection of the geometry of the extraction structure, the appropriate shape of the luminophore or scintillator body itself, the refractive index of the materials used to form any of the layers of the extraction structure, and the modulation of the refractive index of the material(s) used in the extraction structure or individual layer(s) thereof may all be tailored or adjusted as necessary to provide an optimised overall output of light or other radiation emitted from the optical element body having been directionally modified to a desired degree, energy level or direction (i.e. the radiation characteristics) or any combination thereof.

Turning now to FIGS. 9 to 23, these drawings show various further embodiments of optical element within the scope of the invention, and are presented to further illustrate and explain various possible constructions, configurations and positionings of extraction structure applied to bodies of various example radiation converting monocrystalline materials, as well as illustrating and explaining various possible types and manners of radiation directional modifications that may be achievable by use of various embodiments of the invention.

Figure 9:
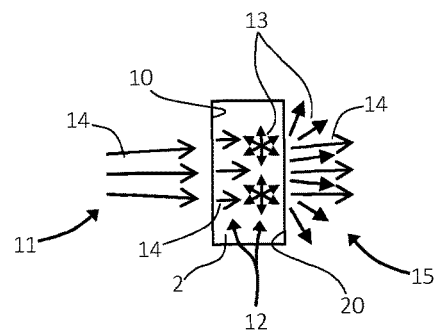
FIG. 9 is an explanatory schematic sectional view of an example of a generalised radiation conversion process explaining the different portions of the radiation as it interacts with the body of radiation converting monocrystalline material, as shown in and described with reference to the subsequent Figures.

As a preliminary, FIG. 9 shows in principle a schematic sectional view of an example of a generalised radiation conversion process explaining different portions of radiation as it interacts with the body of radiation converting monocrystalline material, as shown in and described with reference to the subsequent drawings. As shown there, its main features are:

a body of radiation converting material 2;
input side (input surface) 10 of the radiation converting material body 2;
output side (output surface) 20 of the radiation converting material body 2;
entering or input radiation 11 (typically converting radiation);
exiting or output radiation 15 (typically a mixture of converting and converted radiation);
radiation 12 propagating or generated in the material body (typically a mixture of converting and converted radiation);
radiation 13 generated in the material body 2 (typically converted radiation, i.e. radiation converted from converting/entering radiation) exiting or propagating within the material body 2;
converting radiation 14 (typically present in the input radiation) entering, propagating within or exiting the material body 2.

FIG. 9 also shows entering radiation 11 partially converted to other radiation 13 within the body 2. It is also to be noted that a portion of converting 14 and a portion of converted 13 radiation exit the body 2 naturally (i.e. directionally unmodified) since no extraction structure is applied to the body 2.

Figure 10:
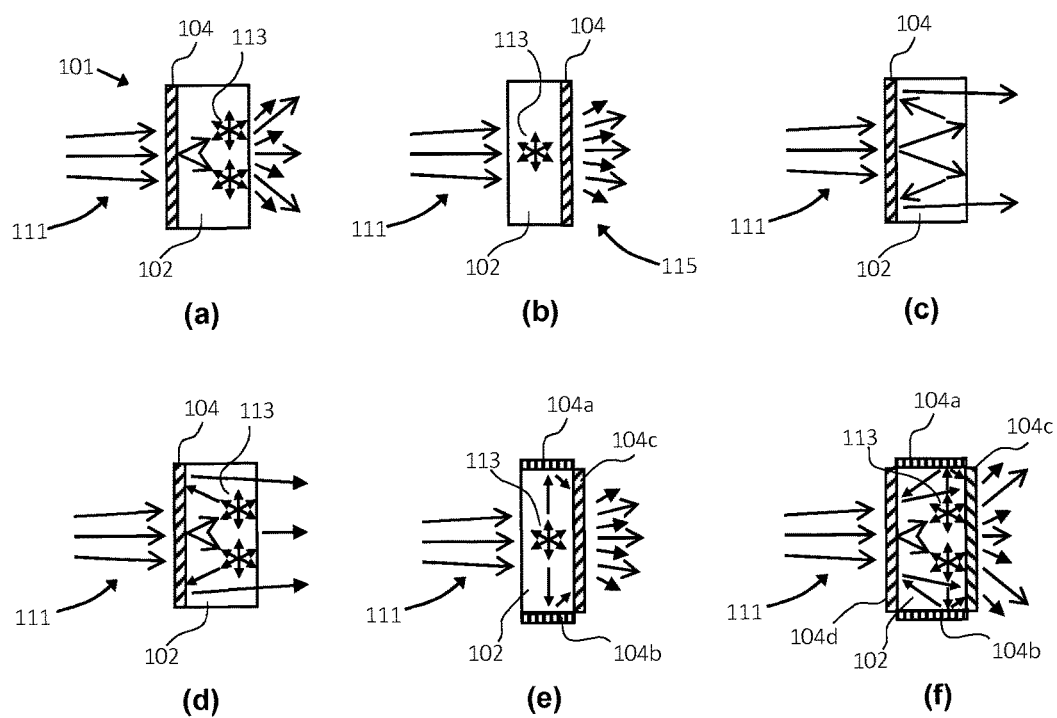
FIGS. 10(a)-(f) are schematic sectional views of various embodiments of optical element within the scope of the invention showing various configurations of extraction structures and possible directional modifications of radiation outputted therefrom.

FIGS. 10(*a*) to (*f*) are schematic sectional views of various embodiments of optical element 101 within the scope of the invention showing various configurations of extraction structures 104 and possible directional modifications of radiation outputted therefrom. Each of these Figures shows the following:

FIG. 10(*a*): entering radiation 111 directionally modified by extraction structure 104; then partially converted to other radiation 113 within the body 102;

FIG. 10(*b*): entering radiation 111 partially converted to other radiation within the body 102; exiting radiation 115 directionally modified by extraction structure 104;

FIG. 10(*c*): entering radiation 111 directionally modified by extraction structure 104; further being redirected after propagating within the body 102 (note: converted radiation not shown);

FIG. 10(*d*): entering radiation 111 directionally modified by extraction structure 104; then partially converted to other radiation 113; converted radiation 113 redirected after propagating within the body 102 (note: converting radiation not shown at the output);

FIG. 10(*e*): entering radiation 111 partially converted to other radiation 113; portion of the converted radiation 113 directionally modified by extraction structures 104*a*, 104*b* after propagation within the body 102; both converting and converted radiation further directionally modified at the exit by extraction structure 104*c*;

FIG. 10(*f*): entering radiation 111 directionally modified by extraction structure 104*d*; then partially converted to other radiation 113 within the body 102; portion of converted radiation directionally modified by extraction structures 104*a*, 104*b* after propagation within the body 102; both converting and converted radiation further directionally modified at the exit by extraction structure 104*c*.

Figure 11:
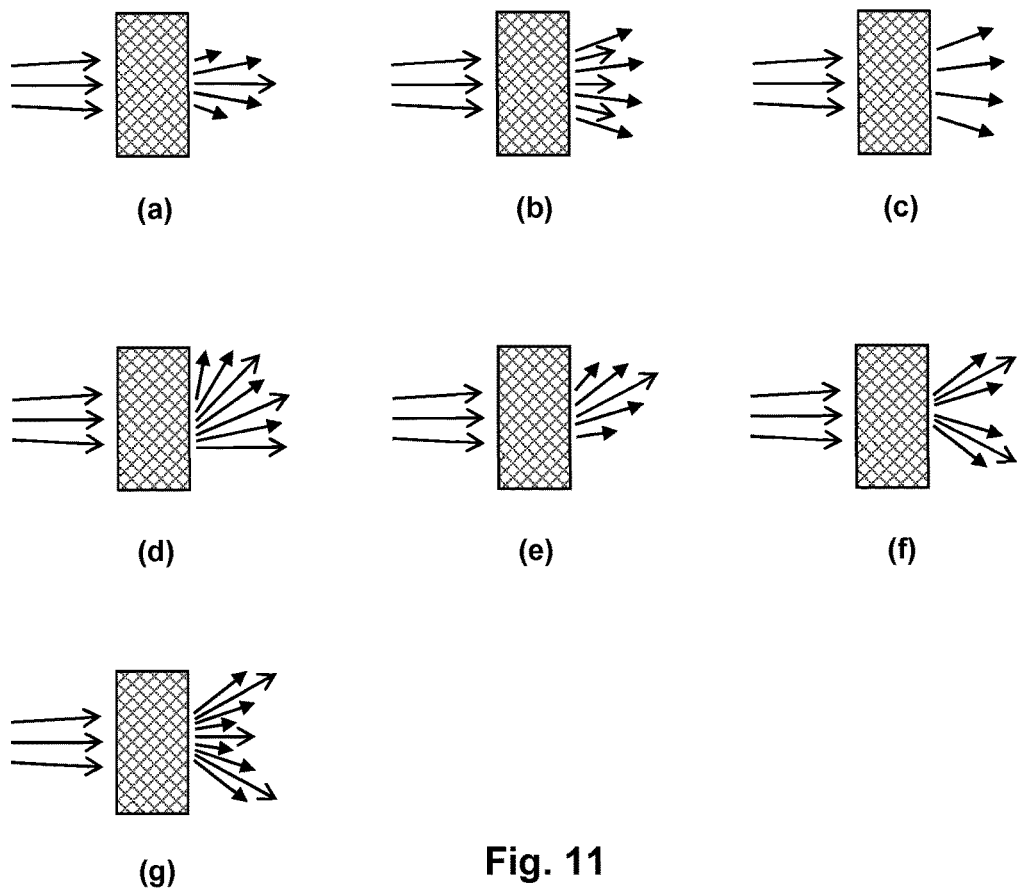
FIGS. 11(a)-(g) are schematic sectional views of various types of directional modification of output radiation that may be achieved by use of various embodiments of the invention.
Figure 12:
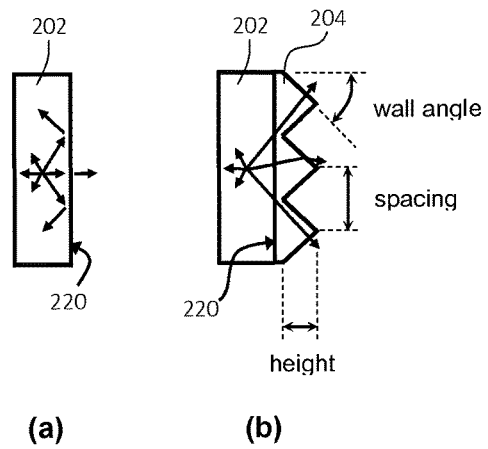
FIGS. 12 to 23 are schematic sectional views of each of various specific embodiments of optical element in accordance with the invention, showing schematically their respective extraction structure configurations and associated directional modifications of the outputted converted radiation.
Figure 13:
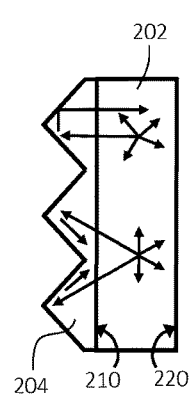

FIGS. 11(*a*) to (*g*) are schematic sectional views of various types of directional modification of output radiation that may be achieved by use of various embodiments of the invention. In these Figures the hatched rectangle represents the material body with extraction structure(s) applied thereto, i.e. constituting the whole optical element. The arrow directions indicate the direction of radiation propagation, and the length of the arrows indicates its relative intensity. Radiation on the left side of the body is entering or input radiation (typically converting radiation), radiation on the right side of the body is exiting or output radiation (typically a combination of radiation converted or generated within the body and a portion of converting radiation). Each of these Figures shows the following:

FIG. 11(*a*): exiting radiation directionally modified to propagate in a narrower angular range;

FIG. 11(b): intensity of converting radiation suppressed at the exit;

FIG. 11(c): intensity of converting radiation eliminated at the exit;

FIG. 11(d): radiation at the exit directionally modified to propagate in a half space;

FIG. 11(e): radiation at the exit directionally modified to propagate in a preferred off-axis direction;

FIG. 11(f): radiation at the exit directionally modified to propagate into two preferred off-axis directions;

FIG. 11(g): radiation at the exit redirected into a specific angular range with a specific intensity distribution within the said range (i.e. is directionally modified to propagate with desired radiation characteristics).

FIGS. 12 to 23 are schematic sectional views of each of various specific embodiments of optical element in accordance with the invention, showing schematically their respective extraction structure configurations and associated directional modifications of the outputted converted radiation. In particular, these Figures show various ways in which the directional modification of output radiation may occur, especially in terms of how the intensity of the radiation exiting the material body in various directions can be controlled, or often increased, in a variety of different ways. It is to be understood that these arrangements illustrated in each of FIGS. 12 to 23 are example embodiments only, and further examples of arrangements may be possible still within the scope of the invention.

For example, an extraction structure in a form of a microrelief may be applied on the output surface of the material body. The microrelief may have a shape of a lamellar (i.e. rectangular or binary), blazed or sinusoidal grating, or an array of square or circular pillars, microlenses, pyramids, cones and any other variations of the foregoing. Each specific type of the microrelief may be formed by a characteristic relief object (e.g. lens, pyramid, cone, etc.) multiplied in a regular or randomized manner across the output surface of the material body. By modifying characteristic geometrical parameters of the characteristic relief object, such as height, diameter, sidewall angle, radius, etc, the intensity of the exiting radiation may be modified, preferably increased compared to the intensity of radiation exiting the material body without the extraction structure being present. FIG. 12(b) illustrates an example of a microrelief type of extraction structure consisting of a pyramidal array 204 applied to the output surface 220 of the material body 202, with the main characteristic geometrical parameters shown and resulting in increased exiting radiation. FIG. 12(a) illustrates total internal reflections of a couple of rays of converted radiation, which cannot exit an output surface 220 of the material body 202 without an associated extraction structure, thus letting less of the output radiation exit the material body 202.

The increase of the intensity of exiting radiation may be achieved also by applying an extraction structure 204 to the input side 210 of the material body 202. In some embodiments such structures may work as retro-reflectors (for example with a shape of a cube-corner or microlens array) sending the converted radiation propagating within the body 202 towards the input surface 210 back to the exit surface 220, as shown on FIG. 13.

Figure 14:
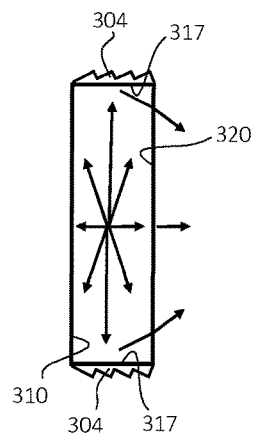

Another example of how to increase of the intensity of the exiting radiation is shown in FIG. 14, where an extraction structure 304 is applied to each of the sides 317 of the material body 302. In this example an extraction structure in a form a relief blazed grating 304 deflects the converted radiation propagating essentially along the input 310 and output 320 surfaces within the material body 302 and towards the output surface 320 where it can exit the material body 302. The direction of propagation and intensity of such deflected radiation may depend on parameters of the grating 304 (e.g. grating shape—blaze angle, grating period, anti-blaze angle; refractive index of the layer carrying the grating; type of reflective grating overcoat; etc.)

The Examples described above in relation to FIGS. 12 to 14 illustrate just some cases of the use of relief structures in an effort to increase amount of radiation exiting the material body. However, any other types of extraction structures may be used instead or additionally, and also any of their combinations, as exemplified in other embodiments of the invention disclosed herein.

Figure 15:
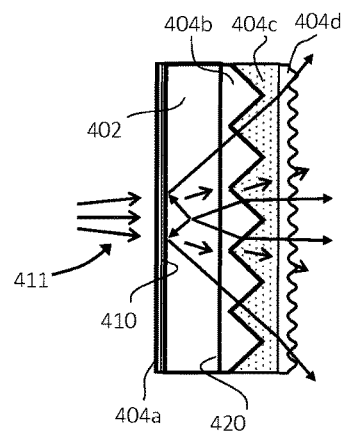

One such more complex example is shown in FIG. 15. In this case an extraction structure in the form of an interference filter 404a is applied to the input surface 410 of the material body 402, which is designed to transmit input converting radiation 411 and to reflect converted radiation propagating within the body 402 towards the input surface 410, and a relief type of extraction structure 404b is applied to the exit surface 420 of the material body 402. An additional absorptive filtering layer 404c, having a refractive index lower than the layer carrying the extraction relief structure 404b itself, may be applied on top of the extraction structure, thereby absorbing a portion of the exiting radiation so as to modify the intensity of selected wavelengths, for example a blue portion of the spectrum, which may result, for example, in a change of "colour temperature" of the exiting radiation. Going even further, an antireflective high frequency relief structure 404d of a "moth-eye" type may also be applied onto the absorbing layer to reduce reflections off the outer surface of the absorbing layer.

Various types of extraction structures may be designed to primarily modify the angular distribution of exiting radiation compared to the distribution of radiation exiting the material body without an extraction structure applied thereto. A few such examples are presented in FIGS. 16 to 23.

Figure 16:
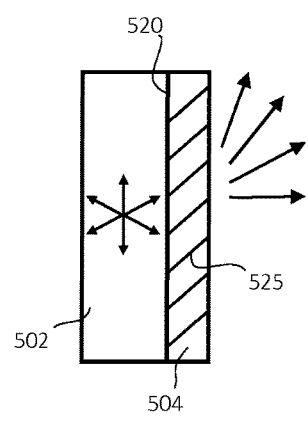

FIG. 16 shows an extraction structure 504 applied to the output surface 520 of the material body 502. The extraction structure is composed of a set of tilted absorbing lines 525, for example holographically exposed in a photosensitive material. Radiation exiting the material body 502 is partially absorbed in the extraction structure 504 and the rest of the radiation exits the extraction structure 504 and propagates within a certain range of directions depending on the geometrical design of the absorbing lines 525 in the extraction structure 504 (e.g. tilt angle, height/length, distance of the absorbing line).

Figure 17:
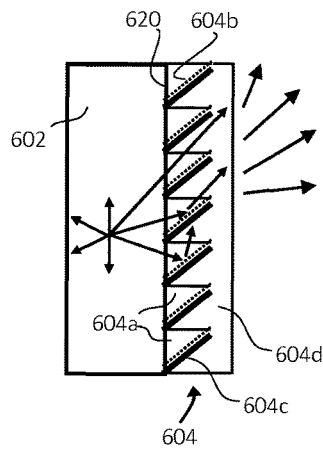

This type of extraction structure may be designed also differently with a use of relief structures and in combination with thin film layers of reflective and absorptive type, as illustrated for example in FIG. 17. Here a blazed grating 604a is applied to the material body 602 as an extraction structure. Blazed facets are coated with a stack of a reflective 604b and absorptive 604c thin-film layers. An entire coated blazed structure is further overlaid with a layer 604d of the same refractive index as the blazed grating structure. This configuration of the extraction structure may increase the amount of exiting radiation compared to the previous example illustrated in FIG. 16.

In some instances it may be desirable not only to deflect exiting radiation into an off-axis direction, but also narrow down its angular spread. The following configurations of extraction structures applied to the material body, as shown in FIGS. 18 to 23, are just a few illustrative examples of how this may be achieved.

Figure 18:
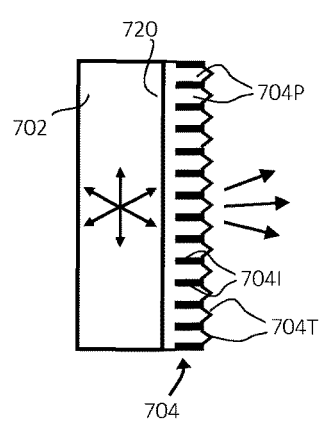

FIG. 18 shows an extraction structure 704 attached to the output side 720 of the body 702. The extraction structure 704 comprises an array of pillars 704P, for example of rectangular shape. The spaces between the pillars 704P are filled with an absorbing material 704I (e.g. ink, dye). Such a structure prevents a portion of radiation exiting the material body 702 at higher angles, thus narrowing the angular spread of the exiting radiation. At the same time the tops 704T of the pillars 704P may be specifically shaped, e.g. into pyramids or microlenses, to further modify or optimise the angular distribution of the exiting radiation. Again the geometrical parameters of the pillars 704P and their tops 704T (e.g. height, width, wall angles, etc.) may be tuned to achieve desired radiation characteristics at the output.

Figure 19:
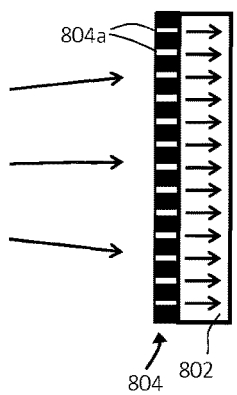
Figure 20:
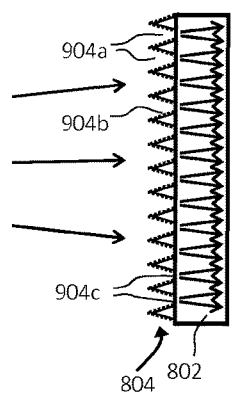
Figure 21:
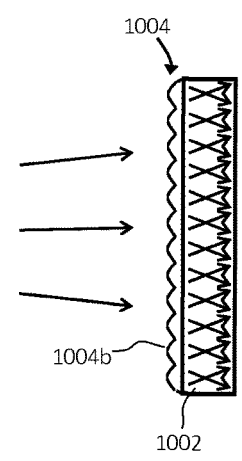

In other examples, another type of extraction structure applied to the material body may be introduced. In this case the converting radiation may be redistributed by one or more extraction structure(s) applied to the input side of the material body, in order to achieve non-homogenous and preferably periodic or quasi-periodic distribution of the converting radiation within the material body. Examples of several such extraction structures are shown in FIGS. 19, 20 and 21:

FIG. 19: extraction structure 804 is made as a set of transmitting slits or apertures 804a, while surrounding material is opaque, e.g. the structure is made in photographic emulsion;

FIG. 20: extraction structure 904 comprises a set of triangularly shaped grooves or wells 904a, coated with a reflective coating 904b, and leaving transmitting slits or apertures 904c at the side of the structure facing material body;

FIG. 21: extraction structure 1004 is made as a set of microlenses 1004b focusing converting radiation into localised spots in the material body 1002.

In all three of the preceding cases the material body is illuminated non-homogeneously by converting radiation after passing through the extraction structure. The degree of non-homogeneity of the converting radiation within the body may be higher if the incident converting radiation is more directional, e.g. collimated or partially collimated. The degree of non-homogeneity may also be controlled and/or modified by proper and appropriate design of the extraction structure features themselves, e.g. slit size, profile height, focal length, etc.

Figure 22:
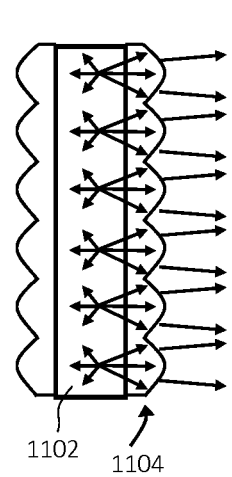
Figure 23:
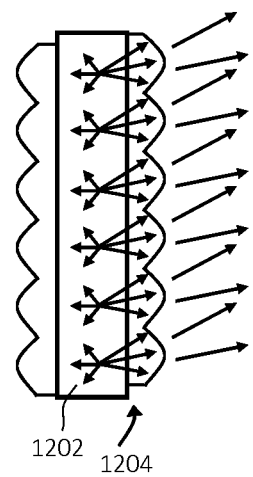

Non-homogeneous distribution of converting radiation within the material body may also generate non-homogeneous distribution of converted radiation within the body, i.e. a set of localised sources of converted radiation. Radiation from such sources may then be further directionally modified, e.g. collimated, quasi-collimated and/or deflected, by an extraction structure applied to the output side of the material body. Such an extraction structure, containing features which can perform an appropriate optical function, e.g. collimation and/or deflection, may have to be registered with respect to the sources localised within the material body, i.e. the extraction structure features may preferably have the same distribution along the output surface as the sources of converted radiation within the body. FIG. 22 illustrates a simplified mechanism of collimation of the converted radiation using a microlens array 1104 at the output of the material body 1102 as an extraction structure. FIG. 23 is similar, but also includes a mechanism of deflection of the converted radiation using an offsetting of the extraction structure 1204 relative to the localised sources of the converted radiation within the body 1202.

It is to be understood that the above description of embodiments and aspects of the invention has been by way of non-limiting examples only, and various modifications may be made from what has been specifically described and illustrated whilst remaining within the scope of the invention as defined in the appended claims.

Throughout the description and claims of this specification, the words "comprise" and "contain" and variations of the words, for example "comprising" and "comprises", mean "including but not limited to", and are not intended to (and do not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

The invention claimed is:

1. An optical element comprising:
   a body of radiation converting monocrystalline material, and
   an extraction structure applied to at least one surface of the body of radiation converting monocrystalline material;
   wherein the extraction structure is constructed and configured such that radiation at an output of the body of radiation converting monocrystalline material is directionally modified, as compared with radiation at the output of the body of radiation converting monocrystalline material in the absence of said extraction structure, by interaction of radiation selected from the group consisting of radiation entering the body, radiation propagating within the body and radiation exiting the body, of radiation converting monocrystalline material with the said extraction structure;
   and wherein the extraction structure is configured such that, for at least one wavelength of the radiation at the output of the said body, the energy or intensity of the radiation at the output of the body of radiation converting monocrystalline material in at least one direction of propagation is increased, compared to the energy or intensity of the radiation at the output of the said body in the said direction in the absence of the said extraction structure.

2. An optical element according to claim 1, wherein the extraction structure is configured such that it modifies one of the following (i)-(iii):
   (i) the energy or intensity of the radiation at the output of the body of radiation converting monocrystalline material via interactions of radiation entering and/or propagating within and/or exiting the said body with the said surface,
   (ii) the directional distribution of radiation selected from the group consisting of exiting, entering, and propagating within the body of radiation converting monocrystalline material via interactions with the said surface,
   (iii) a combination of both (i) and (ii),
   wherein in both cases (i) and (ii) the said directional modification is in comparison with radiation at the same output of the body but in the absence of the said extraction structure(s) applied thereto.

3. An optical element according to claim 1, wherein the said output of the body of radiation converting monocrystalline material at which the directional modification of the radiation is defined is an output surface or an output region or portion of the said body.

4. An optical element according to claim 1, wherein the at least one surface of the body of radiation converting monocrystalline material having an extraction structure applied thereto is selected from the group consisting of:
  (i) a respective output surface of the body, whereby the extraction structure acts to directionally modify radiation selected from the group consisting of radiation exiting the body, propagating within the body, and interacting with the respective output surface;
  (ii) a respective input surface of the body, whereby the extraction structure acts to directionally modify radiation selected from the group consisting of radiation entering the body, propagating within the body, and interacting with the respective input surface; and
  (iii) a respective surface that is an other surface and such other surface is not an input surface and is not an output surface thereof, whereby the extraction structure acts to directionally modify radiation selected from the group consisting of radiation passing through the body, generating within the body, propagating within the body, and interacting with that other surface.

5. An optical element according to claim 4, wherein (iii) is satisfied and wherein the said other surface is any side or lateral surface of the body.

6. An optical element according to claim 1, wherein the radiation converting monocrystalline material comprises a material selected from the group consisting of a luminescent material and a scintillator material.

7. An optical element according to claim 1, wherein the radiation converting monocrystalline material comprises a monocrystalline complex oxide with a composition according to the following general formula (I):

$$P_xQ_yO_z:R \qquad (I)$$

in which:
  P is one or more selected from Gd, Lu, Tb, Y, Pb, Zn, Ca, Cd, Bi, La;
  Q is one or more elements selected from Al, Ga, Si, Sc, W, Ge, B;
  O is the element oxygen;
  x and y are each independently a positive integral or non-integral number, and x is in the range $0<x\leq3$ and y is in the range $0<y\leq5$;
  the ratio x/y is in the range from 0.44 to 2.55;
  z is an integral or non-integral number in the range from 2.5 to 12.5;
  R is at least one doping element selected from the group consisting of Ce, Pr, Nd, Yb, Sm, Eu, Dy, Mn, Mg, Zr, Cu, Cr, Ti; and
  the content of R in the material is in the range from 0 to 20 mol %.

8. An optical element according to claim 7, wherein the said complex oxide material is selected from any one of the structural groups represented by garnets, orthosilicates, perovskites and pyrosilicates, and wherein, in the compositional formula (I):
  x is an integer selected from 1, 2 and 3;
  y is an integer selected from 1, 4 and 5; and
  z is an integer selected from 3, 4, 5 and 12;
  wherein the aforementioned values of x, y and z are defined in the absence of any R, and if R is present then it replaces a proportion of at least one of the said defined amounts of P and Q present.

9. An optical element according to claim 1, wherein the radiation converting monocrystalline material comprises a monocrystalline sesquioxide with a composition according to the following alternative general formula (II):

$$S_{s-t}O_u:T_t \qquad (II)$$

in which:
  S is one or more elements selected from Al, Lu, Gd Tb, La;
  O is the element oxygen;
  s is a number in the range from 0.9 to 2.5;
  t is a number in the range from 0 to 1;
  u is a number in the range from 2.8 to 3.2; and
  T is at least one doping element selected from the group consisting of Ce, Eu, Pr, Yb, Nd, Er, Tm, Ti, Mn.

10. An optical element according to claim 1, wherein the body of radiation converting monocrystalline material is in the form selected from the group consisting of a generally planar plate, a generally planar platelet, a generally planar sheet, a substantially planar plate, a substantially planar platelet, and a substantially planar sheet.

11. An optical element according to claim 1, wherein the extraction structure is applied to at least one of the group consisting of one surface, face, and side of the body of radiation converting monocrystalline material, the said surface(s), face(s) or side(s) constituting one side of an interface of the body at which, in use, radiation would undergo total internal reflection (TIR) were it not to be for the presence of the extraction structure thereon.

12. An optical element according to claim 1, wherein the extraction structure comprises at least one optical structure selected from the group consisting of a micro-structural, nano-structural and thin-film based optical structure applied to at least one of the group consisting of surface, face, and side of the body of radiation converting monocrystalline material with which radiation selected from the group consisting of exiting the body of radiation, entering the body of radiation and propagating within the body of radiation converting monocrystalline material interacts.

13. An optical element according to claim 12, wherein the or each optical structure comprises one or more layers or sub-layers, each of which layers or sub-layers having optical properties and optical function(s) wherein the optical properties and optical functions comprise one or more optical properties and optical functions selected from the group consisting of: optical properties which are (i) the same as the optical properties of the other layers in the optical structure, (ii) the same as the optical properties of the other sublayers in the optical structure, (iii) different from the optical properties of the other layers in the optical structure, (iv) different from the optical properties of the other sublayers in the optical structure, (v) the same as the optical functions of the other layers in the optical structure, (vi) the same as the optical functions of the other sublayers in the optical structure, (vii) different from the optical functions of the other layers in the optical structure, and (viii) different from the optical functions of the other sublayers in the optical structure;
  wherein the optical properties or optical functions of any one or more layers or sub-layers of the optical structure(s) which form(s) the extraction structure is/are selected from any one or more of the group consisting of the following:
    a filter,
    a semi-transparent mirror, a reflective layer,
an anti- (or non-)reflective layer,
a refractive layer,
a diffractive layer,
an optical lens or an array of lenses or lenslets,
an interference structure, or a grating or interference filter,
an optical modulation layer, or a layer that modulates amplitude, phase or polarization of radiation incident thereon or passing therethrough,
a layer with a modulated, or locally modulated, refractive index or complex refractive index,
a surface relief layer,
a holographic layer.

14. An optical element according to claim 13, wherein the one or more layers or sub-layers of the optical structure is/are formed from one or more materials selected from plastics materials, metals and metal alloys, dielectric materials, and any combination of any of the foregoing materials, and wherein the thickness of the one or more layers and sub-layers forming the or each optical structure is collectively from about 10 nm up to about 1 or 2 or 5 or 10 or 20 or 50 or 100 or 200 or 500 or 1000 micrometres.

15. An optical element according to claim 1, wherein the body of radiation converting material is selected from the group consisting of a generally planar plate, a generally planar platelet and a generally planar sheet having a cuboidal three-dimensional shape, and at least one of its major faces has applied thereto one or more said extraction structure(s).

16. An optical element according to claim 15, wherein either or both of the body's minor faces also have applied thereto at least one respective extraction structure.

17. An optical element according to claim 1, wherein the extraction structure comprises an optical structure comprising a plurality of layers selected from the group consisting of layers and sub-layers, and wherein at least one of the said layers or sub-layers is constituted by being selected from the group consisting of a surface region, a portion and a layer of the said body of radiation converting monocrystalline material itself.

18. A device comprising an optical element according to claim 1, wherein the device is selected from:
(i) an LED or LD device, and
(ii) an ionizing radiation detector device.

19. A method of at least partially converting radiation incident on or passing through or generated within or propagated within an optical element, comprising:
providing an optical element according to claim 1; and
selected from the group consisting of applying onto the body of radiation converting monocrystalline material, passing through the body of radiation converting monocrystalline material, generating within the body of radiation converting monocrystalline material and propagating within the body of radiation converting monocrystalline material, radiation to be converted;
whereby radiation selected from the group consisting of exiting the body of radiation converting monocrystalline material, entering the body of radiation converting monocrystalline material, generated within the body of radiation converting monocrystalline material and propagated within the body of radiation converting monocrystalline material, is directionally modified via interaction(s) with the said extraction structure applied thereto,
and whereby for at least one wavelength of the radiation at the output of the said body, the energy or intensity of the radiation at the output of the body of radiation converting monocrystalline material in at least one direction of propagation is increased, compared to the energy or intensity of the radiation at the output of the said body in the said direction in the absence of the said extraction structure.

20. A method according to claim 19, which is a method of directionally modifying radiation selected from the group consisting of exiting the body of radiation converting monocrystalline material, entering the body of radiation converting monocrystalline material and propagating within the body of radiation converting monocrystalline material, within an optical element comprising the body of radiation converting monocrystalline material, wherein the radiation selected from the group consisting of applied onto the body of radiation converting monocrystalline material, passed through the body of radiation converting monocrystalline material, generated within the body of radiation converting monocrystalline material and propagated within the body of radiation converting monocrystalline material, and at least partially converted by interaction(s) with the said body of radiation converting monocrystalline material.

* * * * *